(12) United States Patent
Gubenko et al.

(10) Patent No.: US 8,411,711 B2
(45) Date of Patent: Apr. 2, 2013

(54) SEMICONDUCTOR LASER WITH LOW RELATIVE INTENSITY NOISE OF INDIVIDUAL LONGITUDINAL MODES AND OPTICAL TRANSMISSION SYSTEM INCORPORATING THE LASER

(75) Inventors: Alexey Gubenko, Dortmund (DE); Alexey Kovsh, Dortmund (DE); Greg Wojcik, Santa Clara, CA (US); Daniil Livshits, Dortmund (DE); Igor Krestnikov, Dortmund (DE); Sergey Mikhrin, Dortmund (DE)

(73) Assignee: Innolume GmbH, Dortmund (DE)

( * ) Notice: Subject to any disclaimer, the term of this patent is extended or adjusted under 35 U.S.C. 154(b) by 321 days.

(21) Appl. No.: 12/630,367

(22) Filed: Dec. 3, 2009

(65) Prior Publication Data
US 2010/0142973 A1 Jun. 10, 2010

Related U.S. Application Data

(63) Continuation-in-part of application No. 11/938,472, filed on Nov. 12, 2007, now Pat. No. 7,835,408, which is a continuation-in-part of application No. 11/295,943, filed on Dec. 7, 2005, now Pat. No. 7,561,607, and a continuation-in-part of application (Continued)

(51) Int. Cl.
*H01S 3/10* (2006.01)
*H01S 5/00* (2006.01)
(52) U.S. Cl. ............... 372/28; 372/43.01; 372/50.1
(58) Field of Classification Search ............ 372/28, 372/29.014, 29.015, 29.022, 38.07, 38.08, 372/43.01, 50.1, 92, 99
See application file for complete search history.

(56) References Cited

U.S. PATENT DOCUMENTS

| | | | |
|---|---|---|---|
| 4,100,562 | A | 7/1978 | Sugawara et al. |
| 4,368,481 | A | 1/1983 | Ohashi et al. |
| 4,438,447 | A | 3/1984 | Copeland, III et al. |
| 4,625,305 | A | 11/1986 | Epworth |
| 4,720,468 | A | 1/1988 | Menigaux et al. |
| 4,734,910 | A | 3/1988 | Izadpanah |
| 4,759,023 | A | 7/1988 | Yamaguchi |
| 4,839,884 | A | 6/1989 | Schloss |
| 4,918,497 | A | 4/1990 | Edmond |
| 4,959,540 | A | 9/1990 | Fan et al. |

(Continued)

FOREIGN PATENT DOCUMENTS

| | | |
|---|---|---|
| EP | 1341333 | 9/2003 |
| JP | 9-270508 A | 10/1997 |

(Continued)

OTHER PUBLICATIONS

Schimpe, R., "Theory of intensity noise in semiconductor laser emission", Z. Phys. B—Condensed Matter, 52, 289 (1983).

(Continued)

*Primary Examiner* — Armando Rodriguez
(74) *Attorney, Agent, or Firm* — Brown & Michaels, PC

(57) ABSTRACT

A semiconductor laser comprises an electrically isolated active section and at least one noise reducing section and operates on a ground state transition of a quantum dot array having inhomogeneous broadening greater than 10 nm. The laser preferably emits more than 10 optical modes such that a total relative intensity noise of each optical mode is less than 0.2% in the 0.001 GHz to 10 GHz range. The spectral power density is preferably higher than 2 mW/nm. An optical transmission system and a method of operating a quantum dot laser with low relative intensity noise of each optical mode are also disclosed.

42 Claims, 24 Drawing Sheets

Related U.S. Application Data

No. 11/737,946, filed on Apr. 20, 2007, now Pat. No. 7,555,027.

(60) Provisional application No. 61/119,414, filed on Dec. 3, 2008, provisional application No. 60/867,952, filed on Nov. 30, 2006, provisional application No. 60/745,641, filed on Apr. 26, 2006, provisional application No. 60/863,443, filed on Oct. 30, 2006.

(56) References Cited

U.S. PATENT DOCUMENTS

| | | |
|---|---|---|
| 4,980,568 A | 12/1990 | Merrick et al. |
| 4,989,201 A | 1/1991 | Glance |
| 5,153,933 A | 10/1992 | Smith et al. |
| 5,190,883 A | 3/1993 | Menigaux et al. |
| 5,193,131 A | 3/1993 | Bruno |
| 5,208,822 A | 5/1993 | Haus et al. |
| 5,214,664 A | 5/1993 | Paoli |
| 5,265,112 A | 11/1993 | Noll et al. |
| 5,274,649 A | 12/1993 | Hirayama et al. |
| 5,291,010 A | 3/1994 | Tsuji |
| 5,298,787 A | 3/1994 | Bozler et al. |
| 5,321,786 A | 6/1994 | Valette et al. |
| 5,345,557 A | 9/1994 | Wendt |
| 5,357,122 A | 10/1994 | Okubora et al. |
| 5,382,810 A | 1/1995 | Isaksson |
| 5,463,229 A | 10/1995 | Takase et al. |
| 5,523,557 A | 6/1996 | Bruno |
| 5,536,974 A | 7/1996 | Nishiguchi |
| 5,539,763 A | 7/1996 | Takemi et al. |
| 5,548,433 A | 8/1996 | Smith |
| 5,568,499 A | 10/1996 | Lear |
| 5,569,934 A | 10/1996 | Fujii et al. |
| 5,604,361 A | 2/1997 | Isaksson |
| 5,608,231 A | 3/1997 | Ugajin et al. |
| 5,633,527 A | 5/1997 | Lear |
| 5,663,592 A | 9/1997 | Miyazawa et al. |
| 5,673,284 A | 9/1997 | Congdon et al. |
| 5,699,378 A | 12/1997 | Lealman et al. |
| 5,705,831 A | 1/1998 | Uemura et al. |
| 5,710,436 A | 1/1998 | Tanamoto et al. |
| 5,728,605 A | 3/1998 | Mizutani |
| 5,767,508 A | 6/1998 | Masui et al. |
| 5,801,872 A | 9/1998 | Tsuji |
| 5,802,084 A | 9/1998 | Bowers et al. |
| 5,812,574 A | 9/1998 | Takeuchi et al. |
| 5,812,708 A | 9/1998 | Rao |
| 5,825,051 A | 10/1998 | Bauer et al. |
| 5,828,679 A | 10/1998 | Fisher |
| 5,854,804 A | 12/1998 | Winer et al. |
| 5,889,903 A | 3/1999 | Rao |
| 5,940,424 A | 8/1999 | Dietrich et al. |
| 5,945,720 A | 8/1999 | Itatani et al. |
| 5,946,438 A | 8/1999 | Minot et al. |
| 6,011,296 A | 1/2000 | Hassard et al. |
| 6,031,243 A | 2/2000 | Taylor |
| 6,031,859 A | 2/2000 | Nambu |
| 6,043,515 A | 3/2000 | Kamiguchi et al. |
| 6,052,400 A | 4/2000 | Nanbu et al. |
| 6,066,860 A | 5/2000 | Katayama et al. |
| 6,093,939 A | 7/2000 | Artigue et al. |
| 6,163,553 A | 12/2000 | Pfeiffer |
| 6,201,638 B1 | 3/2001 | Hall et al. |
| 6,232,142 B1 | 5/2001 | Yasukawa |
| 6,245,259 B1 | 6/2001 | Hohn et al. |
| 6,288,410 B1 | 9/2001 | Miyazawa |
| 6,310,372 B1 | 10/2001 | Katayama et al. |
| 6,318,901 B1 | 11/2001 | Heremans et al. |
| 6,320,204 B1 | 11/2001 | Hirabayashi et al. |
| 6,346,717 B1 | 2/2002 | Kawata |
| 6,392,342 B1 | 5/2002 | Parikka |
| 6,393,183 B1 | 5/2002 | Worley |
| 6,403,395 B2 | 6/2002 | Hirabayashi et al. |
| 6,407,438 B1 | 6/2002 | Severn |
| 6,528,779 B1 | 3/2003 | Franz et al. |
| 6,542,522 B1 | 4/2003 | Arahira |
| 6,545,296 B1 | 4/2003 | Mukaihara et al. |
| 6,600,169 B2 | 7/2003 | Stintz et al. |
| 6,611,007 B2 | 8/2003 | Thompson et al. |
| 6,625,337 B2 | 9/2003 | Akiyama |
| 6,628,686 B1 | 9/2003 | Sargent |
| 6,628,691 B2 | 9/2003 | Hatori |
| 6,645,829 B2 | 11/2003 | Fitzergald |
| 6,661,816 B2 | 12/2003 | Delfyett et al. |
| 6,677,655 B2 | 1/2004 | Fitzergald |
| 6,680,495 B2 | 1/2004 | Fitzergald |
| 6,701,049 B1 | 3/2004 | Awad et al. |
| 6,768,754 B1 | 7/2004 | Fafard |
| 6,782,021 B2 | 8/2004 | Huang et al. |
| 6,813,423 B2 | 11/2004 | Goto et al. |
| 6,816,525 B2 | 11/2004 | Stintz et al. |
| 6,826,205 B1 | 11/2004 | Myers et al. |
| 6,862,312 B2 | 3/2005 | Fafard |
| 6,870,178 B2 | 3/2005 | Asryan et al. |
| 6,996,138 B2 | 2/2006 | Jung et al. |
| 7,106,974 B2 | 9/2006 | Lee et al. |
| 7,123,633 B2 | 10/2006 | Shin et al. |
| 7,555,027 B2 | 6/2009 | Kovsh et al. |
| 7,561,607 B2 | 7/2009 | Kovsh et al. |
| 7,835,408 B2 | 11/2010 | Kovsh et al. |
| 2002/0030185 A1 | 3/2002 | Thompson et al. |
| 2002/0181525 A1 | 12/2002 | Kasukawa |
| 2003/0015720 A1 | 1/2003 | Lian et al. |
| 2003/0025118 A1 | 2/2003 | Yamazaki et al. |
| 2003/0063647 A1 | 4/2003 | Yoshid et al. |
| 2003/0128728 A1 | 7/2003 | Shimizu et al. |
| 2003/0165173 A1 | 9/2003 | Helbing et al. |
| 2004/0009681 A1 | 1/2004 | Fafard |
| 2004/0057485 A1 | 3/2004 | Ohki et al. |
| 2004/0065890 A1 | 4/2004 | Alphonse et al. |
| 2004/0109633 A1 | 6/2004 | Pittman et al. |
| 2004/0228564 A1 | 11/2004 | Gunn et al. |
| 2005/0008048 A1 | 1/2005 | McInerney et al. |
| 2005/0047727 A1 | 3/2005 | Shin et al. |
| 2005/0175044 A1 | 8/2005 | Zakhleniuk et al. |
| 2006/0227825 A1 | 10/2006 | Kovsh et al. |
| 2008/0151950 A1 | 6/2008 | Lin et al. |
| 2008/0198444 A1 | 8/2008 | Otsubo et al. |

FOREIGN PATENT DOCUMENTS

| | | |
|---|---|---|
| JP | 10-112567 A | 4/1998 |
| JP | 2000-012961 A | 1/2000 |
| JP | 2001-298424 A | 10/2001 |
| JP | 2002-134841 A | 5/2002 |
| JP | 2002-368327 A | 12/2002 |
| JP | 2003-234539 A | 8/2003 |
| WO | 00/52795 A1 | 9/2000 |
| WO | 00/52975 A1 | 9/2000 |

OTHER PUBLICATIONS

Agrawal, G. P., "Mode-partition noise and intensity correlation in a two-mode semiconductor laser", Phys. Rev. A, 37, 2488 (1988).

Nguyen, L. V. T., "Mode-partition noise in semiconductor lasers", Defense Science and Technology Organization (Australia) research report DSTO-RR-0244 (2002).

Su, H., and Lester, L. F, "Dynamic properties of quantum dot distributed feedback lasers: high speed, linewidth and chirp", J. Phys. D: Appl. Phys. 38, 2112 (2005).

Ghosh, S. et al., "Dynamic characteristics of high-speed In0.4Ga0.6As/GaAs self-organized quantum dot lasers at room temperature", Appl. Phys. Lett., 81, 3055 (2002).

Homar, M. et al. "Traveling Wave Model of a Multimode Fabry-perot laser in Free Running and External Cavity Configuration" IEEE Journal of Quantum Electronics vol. 32, No. 3, Mar. 1996.

Ohtsu, Motoichi et al. "Analysis of Mode partitioning and Mode Hopping is Semiconductor Lasers", IEEE Journal of Quantum Electronics, vol. 25, No. 1, Jan. 1989.

Yamada, Minoru et al. "Time-Dependent Measurement of the Mode-Competition Phenomena Among Longitudinal Modes in Long-Wavelength Lasers." IEEE Journal of Quantum Electronics vol. 39, No. 12 Dec. 2003.

Nagarajan, Radhakrishnan et al. "High Speed Quantum-Well lasers and Carrier Transport Effects" IEEE Journal of Quantum Electronics vol. 28, No. 10 Oct. 1992.

Fukushima, Toru et al. "Relative Intensity Noise reduction in InGaAs/InP Multiple Quantum Well Lasers with Low Nonlinear Damping" IEEE Photonic Technology Letters, vol. 3, No. 8 Aug. 1991.

Agrawal, Govind P. "Effect of Gain and Index Nonlinearities on Single-Mode Dynamics in Semiconductor Lasers" IEEE Journal of Quantum Electronics vol. 26, No. 11, Nov. 1990.

Sato, Kenji "Optical Pulse Generation Using Fabry-Perot Lasers Under Continuous-Wave Operation", IEEE Journal of Selected Topics in Quantum Electronics vol. 9, No. 5 Sep./Oct. 2003.

Ahmed, Moustafa et al. "Influence of Instantaneous Mode Competition on the Dynamics of Semiconductor Lasers", IEEE Journal of Quantum Electronics vol. 38, No. 6, Jun. 2002.

Henry, Charles H. "Theory of Spontaneous Emission Noise in Open Resonators and its Application to lasers and Optical Amplifiers" Journal of Lightwave technology, vol. LT-4, No. 3, Mar. 1986.

A. P. Bogatov et al., "Anomalous interaction of spectral modes in a semiconductor laser," IEEE J. Quantum Electron., vol. 11, No. 7, pp. 510-515, Jul. 1975.

A.V.Savelyev et al., "Generation of superradiation in quantum dot nanoheterostructures", Semiconductors, v. 42(6), pp. 714-719 (2008).

A. Liu et al., "Silicon photonic integration for high-speed applications", Proceedings of the SPIE, vol. 6898, pp. 68980D-68980D-10. 2008.

Q. Xu et al., "Cascaded silicon micro-ring modulators for WDM optical interconnection", Opt. Express, 14, 20, 2006, pp. 9430-9435.

Q. Xu et al., "12.5 Gbit/s Carrier-Injection-Based Silicon Micro-Ring Silicon Modulators." Opt. Express, 15, 2, 2007, pp. 430-436.

International Search Report and Written Opinion for PCT/US2009/066571 Issued on Jun. 18, 2010.

Gubenko et al. "Error-Free 10 Gbit/s Transmission using individual Fabry-Perot modes of low noise quantum-dot laser." Electronics Letters, vol. 43, No. 25. Dec. 6, 2007.

NL Nanosemicondutor press release. "NL Nanosemiconductor announces Broad Band Lasers based on Quantum Dot Technology." Jun. 6, 2006.

NL Nanosemicondutor press release. "Further Progress in the Development of Broad Band Lasers based on Quantum Dot Technology." Jun. 30, 2006.

www.rp-photonics.com/active_mode_locking.html, "Active Mode Locking", Encyclopedia of Laser Physics and Technology.

A.R. Kovsh, et al., "3.5 W CW Operation of quantum dot laser," Electron. Lett. vol. 35, N. 14 Jul. 1999, pp. 1161-1163.

A.E. Zhukov, et al., "Control of the emission wavelength of self-organized quantum dots: main achievements and present status," Semicond. Sci. Technol. vol. 14, N. 6, Apr. 1999, pp. 575-581.

G. Park, et al., "Low-threshold oxide-confined 1.3-um quantum-dot laser," IEEE photon technol. Lett. vol. 13, N. 3, Mar. 2000, pp. 230-232.

X. Huang, et al., "Passive mode-locking in 1.3 um two-section InAs quantum dot lasers," Appl. Phys. Lett. vol. 78, N. 19, May 2001, pp. 2825-2827.

M.G. Thompson, et al., "10 GHz hybrid modelocking of monolithic InGaAs quantum dot lasers," IEE Electron. Lett. vol. 39, N. 15, Jul. 2003, pp. 1121-1122.

M. Kuntz, et al., "35 GHz mode-locking of 1.3 mm quantum dot lasers," Appl. Phys. Lett. vol. 85, N. 5, Aug. 2004, pp. 843-845.

A.E. Avrutin et al., "Monolithic and Multi-GigaHertz mode-locked semiconductors lasers; Constructions, experiments, models and applications," IEE Proc. Optoelectron. vol. 147, N. 4, Aug. 2000, pp. 251-278.

K.A. Williams et al., "Long wavelength monolithic mode-locked diode lasers," New Journal of Physics, vol. 6, N. 179, Nov. 2004, pp. 1-30.

M.G. Thompson, et al. "Transform-limited optical pulses from 18 GHz monolithic modelocked quantum dot lasers operating at 1.3 um," IEE Electron. Lett. vol. 40, N. 5, Mar. 2004, pp. 346-347.

Jinno, "Correlated and uncorrelated timing jitter in gain-switched laser diodes," IEEE Phot. Tech. Lett., vol. 5, pp. 1140-1143 (1993).

Leonard et al., "Direct formation of quantum-sized dots from uniform coherent islands in InGaAs on GaAs surfaces," Appl. Phys. Lett., vol. 63, pp. 3203-3205 (1993).

Lester et al., "Optical Characteristics of 1.24-um InAs Quantum-Dot Laser Diodes," IEEE Phot. Tech. Lett., vol. 11, pp. 931-933 (1999).

Liu et al., "Gain-Switched picosecond pulse (<10ps) generation from 1.3 um InGaAsP Laser Diodes," IEEE Quan. Elec., vol. 25, pp. 1417-1425 (1989).

Madhukar et al., "Nature of strained InAs three-dimensional island formation and distribution on GaAs(100)," Appl. Phys. Lett., vol. 64, pp. 2727-2729 (1994).

Moison et al., "Self-organized growth of regular nanometer-scale InAs dots on GaAs," Appl. Phys. Lett., vol. 64. pp. 196-198 (1994).

Reithmaier et al., "Single-mode distributed feedback and microlasers based on quantum-dot gain material," IEEE Selec. Top. In Quan. Elec., vol. 8, pp. 1035-1044 (2002).

Shoji et al., "Lasing Characteristics of self-formed quantum-dot lasers with Multi-stacked dot layer," IEEE Selec. Top. In Quan. Elec., vol. 3, pp. 188-195 (1997).

Sogawa et al., "Picosecond lasing dynamics of gain-switched quantum well lasers and its dependence on quantum well structures," IEEE Quan. Elec., vol. 27, pp. 1648-1654 (1991).

Fan, H. et al., "Colliding pulse mode locked laser", (Lasers and Electro-Optics Society 1999 12th Annual Meeting. LEOS '99), IEEE vol. 2, Nov. 8-11, 1999, pp. 701-702.

Haring, R et al., "High-Power Passively Mode-Locked Semiconductor Lasers", IEEE J of Quantum Electronics, vol. 38 (9), Sep. 2002, pp. 1268-1275.

Tamura, K. R. et al., "Modulation Requirements and Transmission Characteristics of Electrically Tunable Mode Locked Lasers with Fiber Bragg Gratings", IEEE Photonics Technology Letters, vol. 14(6), Jun. 2002, pp. 834-836.

Yokoyama, H. et al., "Highly reliable mode-locked semiconductor lasers and their applications" The 4th Pacific Rim Conference on Lasers and Electro-Optics, 2001. CLEO/Pacific Rim 2001. vol.2, pp.II-498-II-499.

H. Benisty et al., "Intrinsic mechanism for the poor luminescence properties of quantum-box systems", Phys. Rev. B 44 (19), Nov. 1991, pp. 10945-10948.

G. Park et al., "Temperature dependence of lasing characteristics for long-wavelength (1.3-um) GaAs-based quantum-dot lasers", IEEE Photon. Technol. Lett. 11(3), Mar. 1999, pp. 301-303.

M. Sugawara et al., "Light emission spectra of columnar-shaped self-assembled InGaAs/GaAs quantum-dot lasers: Effect of homogeneous broadening of the optical gain on lasing characteristics", Appl. Phys. Lett. 74(11), Mar. 1999, pp. 1561-1563.

S. S. Mikhrin et al., "A spatially single-mode laser for a range of 1.25-1.28μm on the basis of InAs quantum dots on a GaAs substrate", Semiconductors 34(1), 119-121 (2000).

M. Grundmann et al., "Progress in quantum dot lasers: 1100 nm, 1300 nm, and high power applications", Jpn. J. Appl. Phys. 39(Part 1, N.4B), Apr. 2000, pp. 2341-2343.

O. B. Shchekin and D. G. Deppe, "The role of p-type doping and the density of states on the modulation response of quantum dot lasers", Appl. Phys. Lett. 80(15), Apr. 2002, pp. 2758-2760.

A. Markus et al., "Simultaneous two-state lasing in quantum-dot lasers", Appl. Phys. Lett. 82(12), Mar. 2003, pp. 1818-1820.

A. E. Zhukov et al., "Output power and its limitation in ridge-waveguide 1.3 μm wavelength quantum-dot lasers", Semicond. Sci. Technol. 18(8), Jul. 2003, pp. 774-781.

A. Markus and A. Fiore, "Modeling carrier dynamics in quantum-dot lasers", Phys. stat. sol. (a) 201 (2), Jan. 2004, pp. 338-344.

S. Fathpour et al., "The role of Auger recombination in the temperature-dependent output characteristics ($T_0=\infty$) of p-doped 1.3 μm quantum dot lasers", Appl. Phys. Lett. 85(22), Nov. 2004, pp. 5164-5166.

Ch. Ribbat et al., "High Power Quantum Dot Laser at 1160 nm"; Phys. Stat. So. (b) 224, No. 3, pp. 819-822 (2001).

A.E. Gubenko et al., "Mode-locking at 9.7 GHz repetition rate with 1.7 ps. pulse duration in two-section QD lasers"; IEE 2004, pp. 51-52.

Avrutin, E.A.; "Dynamic Modal Analysis of Monolithic Mode-Locked Semiconductor Lasers"; IEEE J of Selected Topics in Quantum Electronics, V. 9. No. 3, May 2003, pp. 844-856.

Zhang, L. et al. "Low Timing Jitter, 5 GHz Optical Pulse Form Monolithic Two-section Passively Mode Locked 1250/1310 nm Quantum Dot Lasers for High Speed Optical Interconnects" Optical Society of America, 2004.

Bagley et al. "Broadband Operation of InGaAsP-InGaAs Grin-SC-MQW BH Amplifiers with 115mW Output Power." Electronics Letters, IEE Stevenage, GB, vol. 26, No. 8, Apr. 14, 1990.

International Search Report and Written Opinion dated Mar. 14, 2008 for PCT/EP2007/010313.

Chuang S. L., Physics of Optoelectronic Devices. New York: John Wiley & Sons, 1995.

Yasaka, H., et al. "Multiwavelength light source with precise frequency spacing using mode-locked semiconductor laser and arrayed waveguide grating filter", Conference on Optical Fiber Communication 1996 (OFC), San Jose, CA, USA, Feb. 1996.

Sanjoh, H., et al. "Multiwavelength Light Source with Precise Frequency Spacing Using a Mode-Locked Semiconductor Laser and an Arrayed Waveguide Grating Filter", IEEE Photon. Technol. Lett. 9(6), 818-820 (1997).

Shi, H. et al., "20×5 Gbit/s optical WDM transmitter using single-stripe multiwavelength modelocked semiconductor laser", Electron. Lett. 34(2), 179-180 (1998).

Kim, H. D., et al. "A Low-Cost WDM Source with an ASE Injected Fabry—Perot Semiconductor Laser", IEEE Photon. Technol. Lett. 12(8), 1067-1069 (2000).

K. Sato and H. Toba, "Reduction of Mode Partition Noise by Using Semiconductor Optical Amplifiers", IEEE J. Selected Topics Quantum Electron. 7(2), 328-333 (2001).

Delfyett, P. J., et al. "Optical Frequency Combs From Semiconductor Lasers and Applications in Ultrawideband Signal Processing and Communications", J. Lightwave Technol. 24(7), 2701-2719 (2006).

Krakowski, M. "High power, very low noise, C. W. operation of 1.32 μm quantum-dot Fabry Perot laser diodes", International Semiconductor Laser Conference 2006 (ISLC), Kohala Coast, Hawaï, USA, Sep. 17-21, 2006.

P. Eliseev, Tunable Grating-Coupled Laser Oscillation and Spectral Hole Burning in an InAs Quantum-Dot Laser Diode, IEEE Journal of Quantum Electronics, Apr. 2000, pp. 479-485,vol. 36 No. 4.

Djie, H. S. et al., "Room-temperature broadband emission of an InGaAs/GaAs quantum dots laser", Optics Letters, 32, 44 (2007).

Kovsh, A. et al., "Quantum dot laser with 75nm broad spectrum of emission", Optics Letters, 32(7), pp. 793-795 (2007).

Henry, C.H. et al., "Partition fluctuations in nearly single-longitudinal-mode lasers," J. Lightwave Technol., LT-2, 209 (1984).

SEMICONDUCTOR LASER WITH LOW RELATIVE INTENSITY NOISE OF INDIVIDUAL LONGITUDINAL MODES AND OPTICAL TRANSMISSION SYSTEM INCORPORATING THE LASER

REFERENCE TO RELATED APPLICATIONS

This application claims one or more inventions which were disclosed in Provisional Application No. 61/119,414, filed Dec. 3, 2008, entitled "SEMICONDUCTOR LASER WITH LOW RELATIVE INTENSITY NOISE OF INDIVIDUAL LONGITUDINAL MODES". The benefit under 35 USC §119(e) of the U.S. provisional application is hereby claimed, and the aforementioned application is hereby incorporated herein by reference.

This application is also a continuation-in-part of co-pending patent application Ser. No. 11/938,472, filed Nov. 12, 2007, entitled "OPTICAL TRANSMISSION SYSTEM, which claims one or more inventions which were disclosed in Provisional Application No. 60/867,952, filed Nov. 30, 2006, entitled "OPTICAL TRANSMISSION SYSTEM", and is a continuation-in-part of patent application Ser. No. 11/295,943, filed Dec. 7, 2005, entitled "LASER SOURCE WITH BROADBAND SPECTRUM EMISSION", now U.S. Pat. No. 7,561,607, issued Jul. 14, 2009, and patent application Ser. No. 11/737,946, filed Apr. 20, 2007, entitled "LASER SOURCE WITH BROADBAND SPECTRUM EMISSION", now U.S. Pat. No. 7,555,027, issued Jun. 30, 2009, which claims one or more inventions which were disclosed in Provisional Application No. 60/745,641, filed Apr. 26, 2006, entitled "LASER SOURCE WITH BROADBAND SPECTRUM EMISSION" and Provisional Application No. 60/863,443, filed Oct. 30, 2006, entitled "LASER SOURCE WITH BROADBAND SPECTRUM EMISSION". The aforementioned applications are hereby incorporated herein by reference.

BACKGROUND OF THE INVENTION

1. Field of the Invention

The present invention relates to semiconductor diode lasers and, more particularly, to diode lasers that are capable of emitting a plurality of optical modes at different wavelengths with low relative intensity noise and optical transmission systems utilizing these lasers.

2. Description of Related Art

The use of optical signals having different wavelengths results in greatly increased information carrying capacity by employing dense wavelength-division-multiplexing (DWDM). This technique requires an optical source which is capable of providing a sufficiently large number of signals having different wavelengths (channels). It is currently a common practice to build an optical source for a DWDM system using a plurality of single-frequency distributed feedback lasers (DFBs) 901 generating the signals at different precise stable wavelengths (FIG. 1). Each signal is then modulated by the modulators 902 and then transmitted to the couplers 903. The couplers 903 are used to couple the output signals from the modulators to an AWG multiplexer 904 that combines the signal from the individual DFB lasers. Then, the combined signal is outputted from the AWG multiplexer 904 to a coupler 905 and then comes to an output optical fiber 906. The signals can be transmitted between different elements of the optical transmission system (DFB lasers, modulators, couples, etc) by optical fibers 906.

The complexity of fabrication of a DFB laser 901 results in its high cost, which is further multiplied by the number of lasers 901 to be integrated. Furthermore, an operation wavelength should be independently determined for each single-frequency laser 901. This makes it difficult to build an array of single-frequency lasers 901 with pre-selected wavelength separation. In addition, each laser 901 requires its own system of wavelength stabilization. Considering the possible integration of a multiwavelength laser source with silicon optoelectronic components for future computing, an array of DFB lasers 901 has the further disadvantage of a large footprint. As the number of required optical channels increases and the wavelength separation between channels decreases, all the aforementioned problems of a conventional optical source are enhanced.

SUMMARY OF THE INVENTION

A multimode edge-emitting semiconductor laser has low relative intensity noise (RIN) of individual longitudinal modes. The active region of the laser is based on an inhomogeneously broadened array of self-organized quantum dots (QDs). The laser includes an active section and at least one integrated noise reducing section, where the active section and the noise reducing sections are electrically isolated. The noise reducing section provides mode coupling and synchronization.

The laser emits a plurality of optical modes such that the relative intensity noise of each optical mode is less than 0.2% in the 0.001 GHz to 10 GHz range. In one embodiment, the average optical power per channel is more than 2 mW. The RIN of each longitudinal mode is sufficient to obtain a low bit error rate at high modulation speeds.

In another embodiment, the total RIN is less than 0.1% for at least ten optical modes. In yet another embodiment, the total RIN is less than 0.2% for at least 48 optical modes, and their intensity distribution is very uniform and varies by 30% or less.

In a preferred embodiment, the longitudinal modes are used as independent information channels in a multi-channel optical transmission system. An optical transmission system includes at least one laser that provides a plurality of low RIN optical modes that serve as optical information signals, a transmitter that provides modulation to each optical signal independently and a receiver that provides detection to each optical signal independently.

In a preferred embodiment of a method of the present invention, a quantum dot laser operates with a very low relative intensity noise. The method includes the step of emitting a plurality of optical modes from the laser such that a total relative intensity noise of each optical mode is less than an error-free transmission limit in the 0.001 GHz to 10 GHz range. In a preferred embodiment, the relative intensity noise of each optical mode is less than 0.2% in the 0.001 GHz to 10 GHz range. The method also preferably includes the step of electrically isolating an active section and at least one noise reducing section of the laser, where the active section and noise reducing section are monolithically integrated into the laser. An active region of the laser includes at least one array of quantum dots. The method also includes the step of injecting current at a first current density into the active section. Another preferred embodiment of the method also includes the step of injecting current at a second current density into the noise reducing section, where the first current density is greater than the second current density.

DETAILED DESCRIPTION OF THE INVENTION

Figure 1:
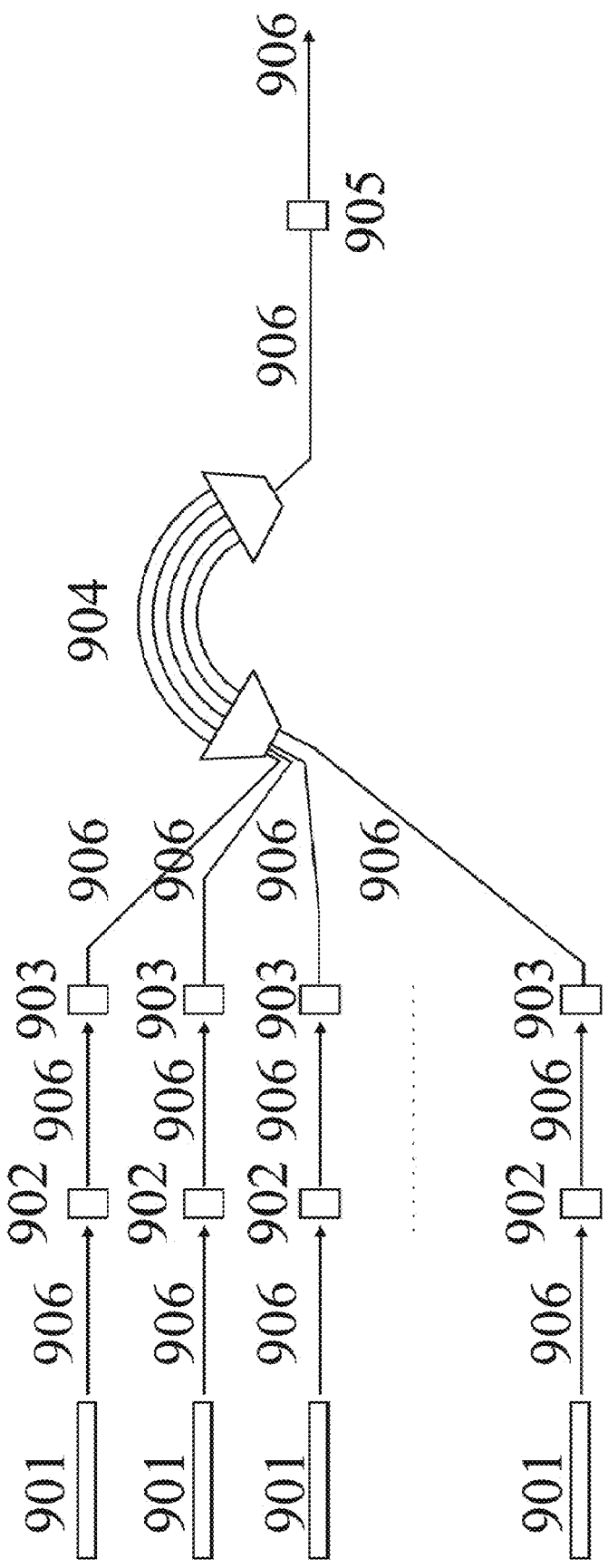
FIG. 1 shows a schematic view of a DWDM source based on a plurality of single-frequency DFB lasers.

A multimode edge-emitting semiconductor laser has low relative intensity noise (RIN) of individual longitudinal modes. The device includes an active section and at least one integrated noise reducing section where the active section and the noise reducing sections are electrically isolated. The laser emits a plurality of optical modes such that a total relative intensity noise of each individual mode is less than 0.2% in a 0.001 GHz to 10 GHz range. An optical transmission system incorporating the laser and a method of operating a quantum dot laser with low relative intensity noise of each optical mode are also disclosed.

The use of a noise reducing section significantly improves the operation of a low RIN laser in several ways, including, but not limited to: (i) increasing the number of longitudinal modes having low RIN; (ii) decreasing the RIN level of multiple longitudinal modes; and (iii) increasing the range of injection current in which low RIN operation takes place.

In one embodiment, the average optical power per channel is more than 2 mW. The RIN of each longitudinal mode is sufficient to obtain a low bit error rate at high modulation speeds. The longitudinal modes can be used as independent information channels in a multi-channel optical communication system. In one embodiment, total RIN is less than 0.1% for at least ten optical modes. In another embodiment, total RIN is less than 0.2% for at least 48 optical modes, and their intensity distribution is very uniform and varies by 30% or less.

A very promising approach for developing a compact and cheap DWDM system is the use of a single laser, capable of emitting a sufficient number of well separated optical modes at different wavelengths, which serve as independent separated channels. An attractive candidate for such a multi-wavelength emitter is a Fabry-Perot laser. This approach reduces requirements for the precision of lasing wavelengths because a channel separation is naturally pre-determined by only one parameter, which is the resonator length. In this case, all channels are preferably stabilized and tracked simultaneously. Typical dimensions of diode lasers are suitable for providing the desired channel spacing. For example, a 40 GHz intermodal spacing requires a cavity length of about 1 mm $$\left(\Delta f = \frac{c/n}{2L}\right).$$

A multi-wavelength laser for optical transmission systems should satisfy several requirements. First, the lasing spectrum should be broad to provide a sufficient number of optical channels. Second, the output power of each optical mode should be high enough to be transmitted for the necessary distance and then to be detected. Third, for integration with microelectronic devices, wavelengths of the modes should be suitable for optical transmission through materials used in microelectronics, including, but not limited to, a silica fiber, a silicon wafer, or a SiGe planar waveguide. For applications in telecommunications, wavelengths of the modes should fall into the O-band (1260-1360 nm) or the C-band (1530-1565 nm) of telecommunication windows. Fourth, the intensity noise of each longitudinal mode should be low enough to obtain a low bit error rate for each optical channel at high modulation speeds, such that it is acceptable for use in a multi-channel optical communication system.

A conventional laser, for example a semiconductor diode laser based on quantum wells, is sometimes capable of providing a relatively broad optical spectrum. This is referred to as multi-frequency laser operation, when the laser emits a number of longitudinal modes of the resonator. However, in a conventional laser, there are at least two limitations which prevent the use of its output in a WDM system. First, the spectral bandwidth is typically only a few nanometers. Therefore, the number of optical channels is limited. Second, temporal stability of a spectral distribution of the optical power is very low or, in other words, the Relative Intensity Noise (RIN) of an individual longitudinal mode is high. Therefore, a split longitudinal mode is very noisy and can not serve as an individual optical channel for data transmission. The first limitation is due to the fact that carrier capture and relaxation to the energy levels in the active region of a conventional laser based on bulk material or quantum wells is very fast and density of states in the active area is high. As a result, optical gain saturation is not very pronounced; carriers lase via existing modes and it is difficult for additional longitudinal modes to emerge. Thus, the width of a conventional quantum well lasing spectrum is typically only a few nanometers.

The second limitation is due to the fact that the active medium is homogeneously broadened. As a result, there is competition between different longitudinal modes for a common gain that is called mode partition noise (Schimpe, R., "Theory of intensity noise in semiconductor laser emission", Z. Phys. B—Condensed Matter, 52, 289 (1983), herein incorporated by reference).

U.S. Patent Publication No. 2004/0057485, published Mar. 25, 2004, entitled "SEMICONDUCTOR LASER DEVICE, SEMICONDUCTOR LASER MODULE, AND OPTICAL FIBER AMPLIFIER", herein incorporated by reference, discloses a semiconductor laser device with decreased relative intensity noise. This effect is achieved using an integrated grating that limits the number of longitudinal modes. This publication discusses reduction of the RIN of the total lasing spectrum only. The RIN of individual modes is not measured or disclosed.

A multi-wavelength laser for optical transmission systems satisfying the four conditions discussed above can be implemented, if the active region is based on an array of quantum dots (QD) with strong three-dimensional confinement of electrons and holes and discrete energy levels, and if such array shows sufficient inhomogeneous broadening for individual QD energy levels.

U.S. Pat. No. 7,555,027, entitled "LASER SOURCE WITH BROADBAND SPECTRUM EMISSION", issued Jun. 30, 2009, and herein incorporated by reference, discloses a method for increasing the spectral bandwidth and the spectral power density of a quantum dot diode laser. The application discloses a laser device capable of emitting a broadband (preferably at least 15 nm) spectrum at a high spectral power density (preferably at least 7 mW/nm). The laser operates on an inhomogeneous broadened ground-state optical transition of quantum dots. The emission wavelength is in the 1200-1300 nm spectral region. Thus, this device satisfies three of the four requirements listed above.

M. Krakowski et al. ("High power, very low noise, C.W. operation of 1.32 μm quantum-dot Fabry-Perot laser diodes", IEEE 20th International Semiconductor Laser Conference, Sep. 17-21, 2006. Conference Digest, Pages: 39-40, herein incorporated by reference) have demonstrated a low RIN of −159 dB/Hz±2 dB/Hz in a wide frequency range from 0.1 GHz to 10 GHz for a laser based on self-organized InAs quantum dots. However, these measurements of the RIN were performed for the total intensity of the laser emission which is the sum of intensities for a number of longitudinal modes. The RIN of an individual longitudinal lasing mode is usually much higher than the RIN of the total laser light (see, for example, R. Schimpe "Theory of intensity noise in semiconductor laser emission", Z. Phys. B—Condensed Matter, v. 52, pp. 289-294 (1983)). Therefore, further development is required in order to achieve a low-noise operation of a multi-frequency diode laser (for example, a Fabry-Perot laser) regarding a RIN level of individual longitudinal modes.

U.S. patent application Ser. No. 11/938,472, entitled "OPTICAL TRANSMISSION SYSTEM", filed Nov. 12, 2007, incorporated herein by reference, discloses a laser capable of operating on an inhomogeneously broadened optical transition of the active region of the laser with a spectral bandwidth of an output lasing spectrum of the laser greater than 5 nm and a spectral power density of the laser greater than 2 mW/nm such that an optical power of the laser is greater than 10 mW. The laser provides a plurality of optical signals at different wavelengths. In a preferred embodiment, the laser is a Fabry-Perot laser operating in a continuous-wave regime and the plurality of optical signals includes a plurality of longitudinal modes of the Fabry-Perot laser resonator. The relative intensity noise (RIN) for each of the longitudinal modes preferably does not exceed −120 dB/Hz at 0.1 GHz, −130 dB/Hz at 1.0 GHz and −140 dB/Hz at 10 GHz. Gubenko et al., "Error-free 10 Gbit/s transmission using individual Fabry-Perot modes of low-noise quantum-dot laser", Electronics Letters, December 2007, Vol. 43 (25), also incorporated herein by reference, and referred to herein as "Gubenko et al.", also discusses a multiwavelength quantum-dot laser with low RIN.

The laser active region in one embodiment of U.S. patent application Ser. No. 11/938,472 represents ten non-identical planes of self-organized quantum dots. Each quantum dot plane was formed by epitaxial deposition of 0.8 nm-thick InAs insertions covered with $In_{0.15}Ga_{0.85}As$ capping layers and embedded into a GaAs matrix. The laser structure has a 0.44 μm-thick $GaAs/Al_{0.35}Ga_{0.75}As$ waveguide. The epitaxial wafer was processed into 3-μm-wide ridge structures. The cavity length is approximately 1 mm as terminated by as-cleaved facets forming two laser mirrors. The laser was driven by a forward CW current of 85 mA, which is 5-times above the lasing threshold.

Figure 2:
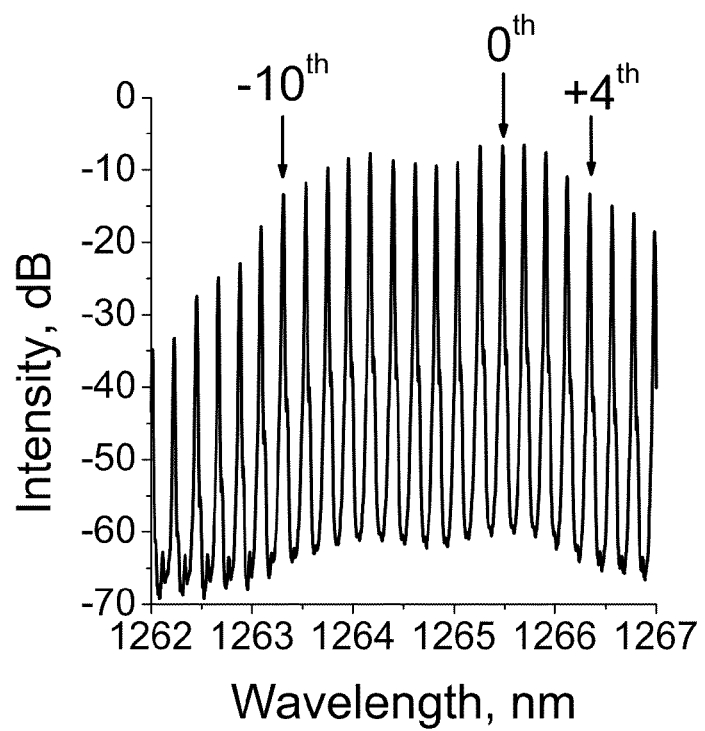
FIG. 2a shows an overall emission spectrum of a QD laser without a noise reducing section.
FIG. 2b shows a filtered intensity of a longitudinal mode for a laser without a noise reducing section.
Figure 2:
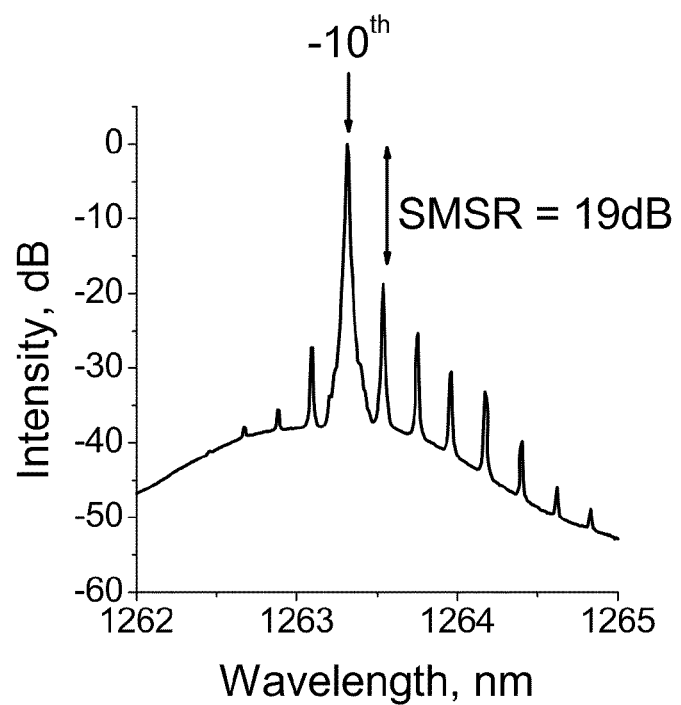

FIG. 2a shows an overall emission spectrum of a quantum dot laser taken at a CW current of 85 mA, which is 5-times above the threshold. An output power is 50 mW per two facets. The spectrum includes a series of longitudinal FP modes separated by 0.22 nm. The $0^{th}$-order mode, i.e. the mode of the maximum intensity, is centered at 1265.5 nm. The full width at half maximum of the whole lasing spectrum is about 2 nm. An external FP etalon can be adjusted to transmit only one longitudinal mode while the intensity of the other modes is significantly suppressed. Experiments were undertaken for longitudinal modes that fall into a wavelength interval from 1263.3 to 1266.4 nm. These modes are indicated in FIG. 2a by an index ranging from $-10^{th}$ to $+4^{th}$. A separation between neighboring longitudinal modes (neighboring optical channels) is 0.22 nm. The average spectral power density of the laser was ~25 mW/nm, and an average optical power per one channel was more than 2 mW. FIG. 2b shows a filtered intensity of $-10^{th}$ longitudinal mode. In this case, as well as for other filtered modes, a side mode suppression ratio better than 19 dB was achieved.

Figure 3:
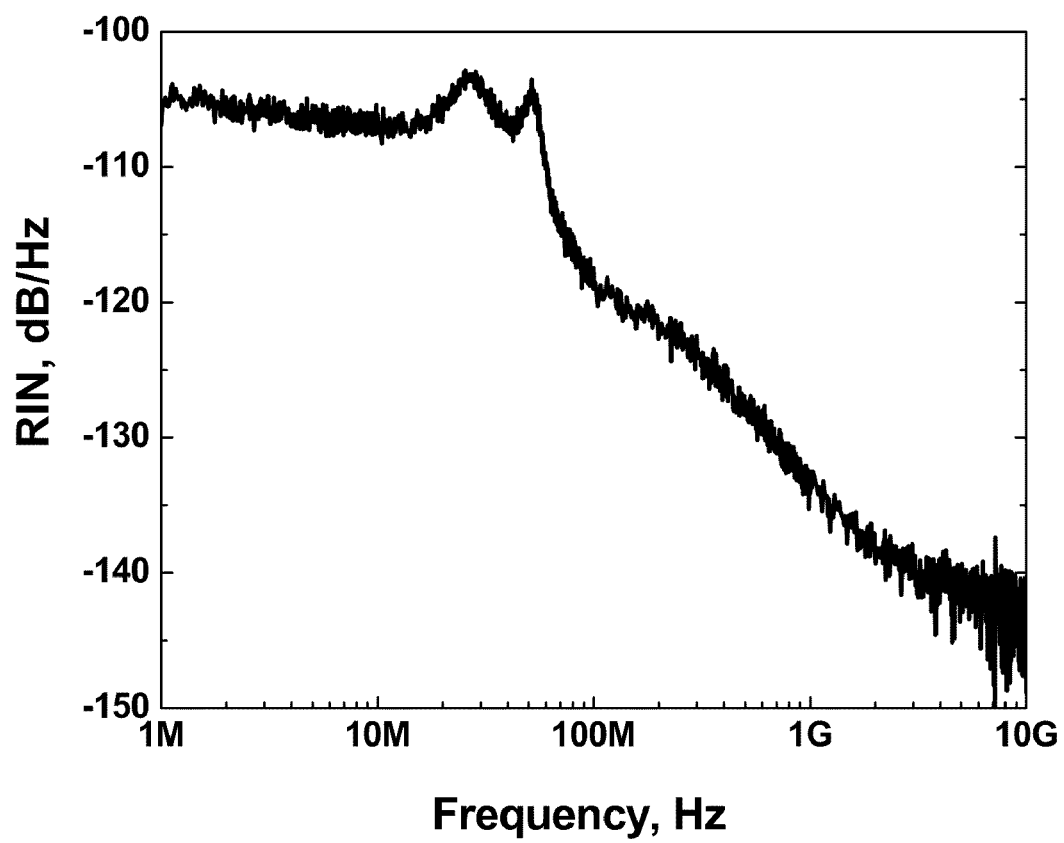
FIG. 3 shows a spectrum of relative intensity noise of filtered modal intensity at 1265.2 nm for a laser without a noise reducing section.

A relative intensity noise spectrum for the spectrally filtered FP mode (modal RIN) is shown in FIG. 3. At low frequencies, the RIN spectrum is nearly flat at a level of −105 dB/Hz. At higher frequencies, the modal RIN is approximately −120 dB/Hz at 0.1 GHz, −133 dB/Hz at 1.0 GHz and −145 dB/Hz at 10 GHz. If a received power is sufficiently high, the bit error rate (BER) is governed by the total RIN, i.e. an integral over the relative intensity noise spectrum. Assuming a 100% modulation depth and a ½ decision level, minimum BER (no photodetector noise) as a function of the total RIN can be estimated as $BER=(\frac{1}{2})erfc[(2\sqrt{2RIN})^{-1}]$, where erfc is the complementary error function. The calculation has shown that a total RIN of less than 0.4% would be acceptable for error-free transmission (BER<$10^{-15}$). From the data of FIG. 3, the total RIN was calculated to be 0.21% over the full frequency range of analysis (0.001 GHz to 10 GHz).

The present invention preferably includes a multimode edge-emitting semiconductor laser with individual longitudinal modes having low relative intensity noise. The designs of the present invention provide better performance compared to the characteristics of the lasers discussed above.

The active region of the laser is based on an array of quantum dots (QDs). A QD is a coherent inclusion of a narrow gap material in a wide gap matrix in which electrons are quantized in all three spatial directions. Thus, a single semiconductor QD has discrete energy levels for electrons and holes. This results in a reduced carrier relaxation rate within an individual QD (so called "phonon bottleneck") described in Benisty, H., Sotomayor-Torres, C. M., Weisbuch, C., Phys. Rev. B, 44, 10945 (1991), herein incorporated by reference. Radiative recombination time in InGaAs/GaAs QDs is in the range of 0.5-1 ns, which is longer than in quantum wells.

To provide sufficiently wide gain spectra for multimode operation, the QD array should be inhomogeneously broadened. Such broadening is caused by natural fluctuations in QD sizes, shapes, and compositions. One example is an array of In(Ga)As/GaAs QDs formed by self-organization phenomena in epitaxial growth. Its typical inhomogeneous broadening is 10-60 meV. In preferred embodiments, the quantum dot arrays in the lasers of the present invention are inhomogeneously broadened by at least 10 meV.

In such an array, quantum dot electronic states of different energy within an inhomogeneously broadened ground-state level belong to spatially separated quantum dots. Therefore, in a quantum dot laser, only a certain portion of the available quantum dots contributes to the lasing process, namely those quantum dots which have an optical transition energy approximately equal to the lasing transition. Other quantum dots act as a reservoir providing charge carriers to the lasing dots. However, if the carrier confinement energy for electron and holes in the QD is sufficiently high, carrier lateral transport between QDs is strongly suppressed because a charge carrier should be first thermally excited from the first quantum dot to a matrix or a wetting layer, then travel across the active region to a second dot, and finally be captured by the second dot. As a result, a refilling process may be significantly slowed down in a quantum dot laser, and therefore, broadening of the laser emission spectrum by side modes can be significantly enhanced.

Figure 4:
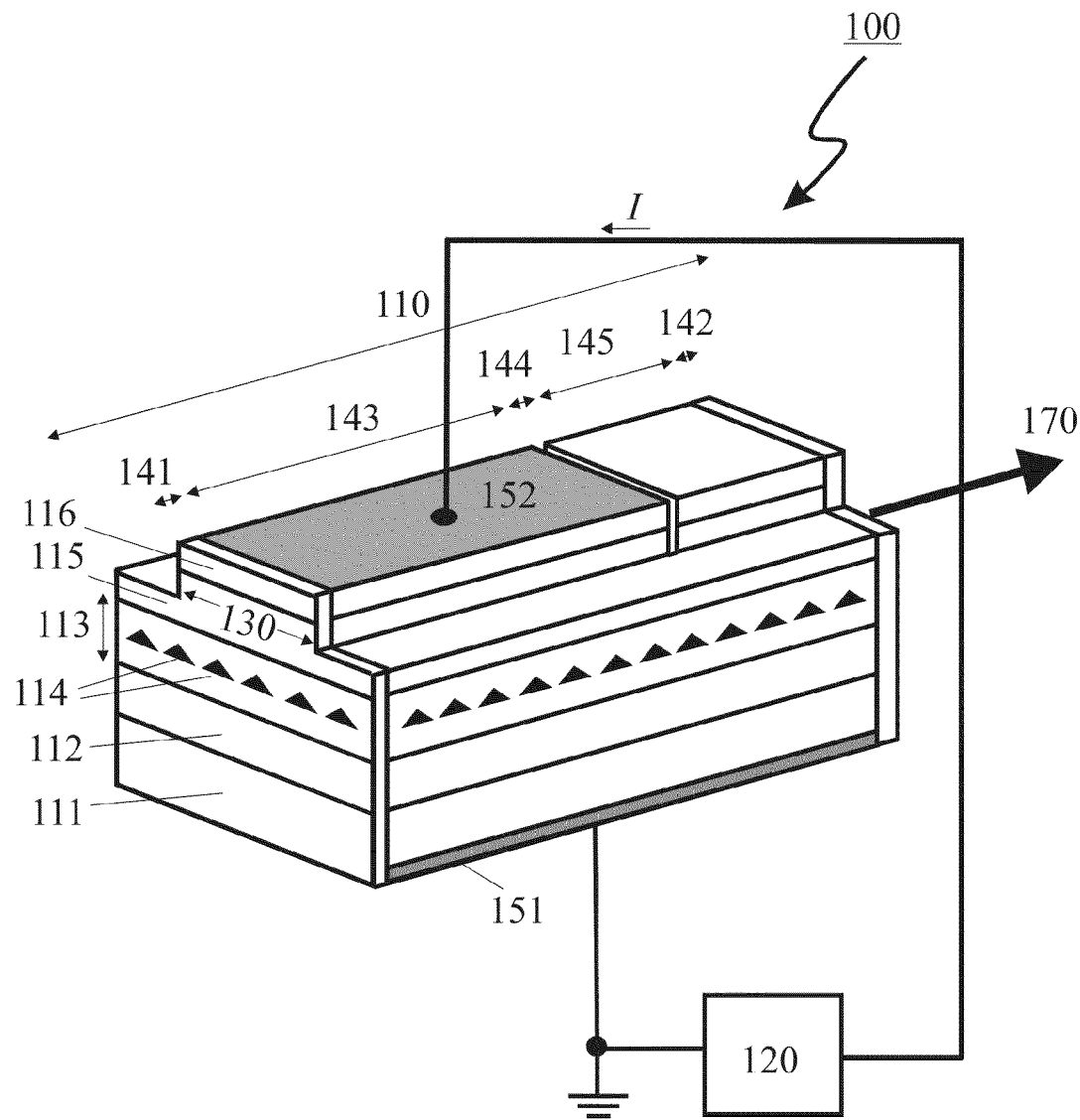
FIG. 4 shows a schematic diagram of a semiconductor laser according to a first embodiment of the present invention.

FIG. 4 schematically shows an isometric view of a laser diode 100 according to a preferred embodiment of the present invention. The laser diode 100 is monolithically integrated on an n+ doped substrate 111. The substrate 111 is preferably an n+ doped GaAs (100) substrate. The laser diode 100 includes a Fabry-Perot optical resonator 110.

A layered structure of the laser 100 includes an n-doped first cladding layer 112, a waveguiding layer 113, a p-doped second cladding layer 115, and a p+ doped contact layer 116. In one embodiment, the layers are an n-doped AlGaAs first cladding layer 112, an (Al)GaAs waveguiding layer 113, a p-doped AlGaAs second cladding layer 115, and a p+ doped GaAs contact layer 116. The layered structure of the laser 100 is preferably deposited on the substrate 111 by molecular beam epitaxy.

The waveguiding layer 113 is preferably a semiconductor matrix which includes an active region 114. The active region 114 (also referred to as the quantum dot active region herein) preferably includes several vertically stacked arrays of self-organized quantum dots separated by spacer layers having a wider bandgap as compared to the QD material. The quantum dots in each of the arrays in the active region 114 have fluctuations in at least one parameter affecting the optical transition energy. These fluctuations may include fluctuations in size, shape, chemical composition, strain, or any combination of these parameters. These fluctuations result in an inhomogeneous broadening of quantum dot optical transitions including the ground-state optical transition. Due to inhomogeneous broadening, each QD array preferably has a full width half maximum of the electroluminescence spectra of at least 10 nm. The QD arrays can be grown using the same growth parameters. In this case, their peak wavelengths are the same. Alternatively, the arrays can be grown in such a way that their peak wavelengths are shifted with respect to each other to necessary spectral intervals. In this case, the total gain spectrum is a superposition of gain spectra of individual QD arrays. Thus, the total gain spectrum is controllably broadened. In a preferred embodiment, the quantum dot layers are formed such that maximal wavelengths of each quantum dot layer are shifted with respect to each other for at least 3 nm.

The QDs have a sufficiently high confinement energy for electrons and holes with respect to a continuum of electronic states (wide bandgap matrix or wetting layer). The active region 114 is capable of providing an optical gain on an inhomogeneously broadened optical transition under appropriate pumping. For the quantum dots used in the present invention, the ground-state optical transition is preferably in the optical region from 1.1 µm to 1.35 µm. This spectral range is useful for optical transmission through many materials, including, but not limited to, a silica fiber, a silicon wafer, or a SiGe planar waveguide.

In one embodiment, the quantum dots are In(Ga)As/GaAs quantum dots. Quantum dots in other material systems, including, but not limited to, InAs/GaSb, InGaP/InGaAsP, and InN/AlGaN, may be used in the laser 100, provided that the ground-state optical transition is inhomogeneously broadened and the confinement energy for electrons and holes is sufficiently high.

The second cladding layer 115 and the contact layer 116 are preferably processed into a ridge structure 130 having a width of about 3-5 µm.

In the first embodiment, the optical resonator 110 includes a first mirror 141, a second mirror 142, an active section 143, and one integrated noise reducing section 145. The active section 143 and noise reducing section 145 are preferably electrically isolated from each other by a trench 144.

An n-ohmic contact 151 is formed on the substrate and a p-ohmic contact 152 is formed on the contact layer 116. The p-ohmic contact is preferably not formed on the noise reducing section 145. The n-ohmic contact 151 is preferably made of materials including, but not limited to, AuGe/Au and AuGe/Ni/Au. The p-ohmic contact 152 is preferably made of materials including, but not limited to, AuZn/Au or Ti/Pt/Au.

If it is preferable from a fabrication viewpoint and to simplify post-growth processing, the p-ohmic contact 152 can be deposited on the noise reducing section 145 but, in this case, the noise reducing section 145 should be electrically isolated from the active section 143. The isolation is preferably formed at the p-contact side of the laser by a trench 144 through the p-ohmic contact 152, the contact layer 116 and a top part of the second cladding layer 115.

The length of the optical resonator 110 is preferably from 0.3 to 10 mm. The noise reducing section 145 is preferably 5-30% of the total length of optical resonator.

Figure 5:
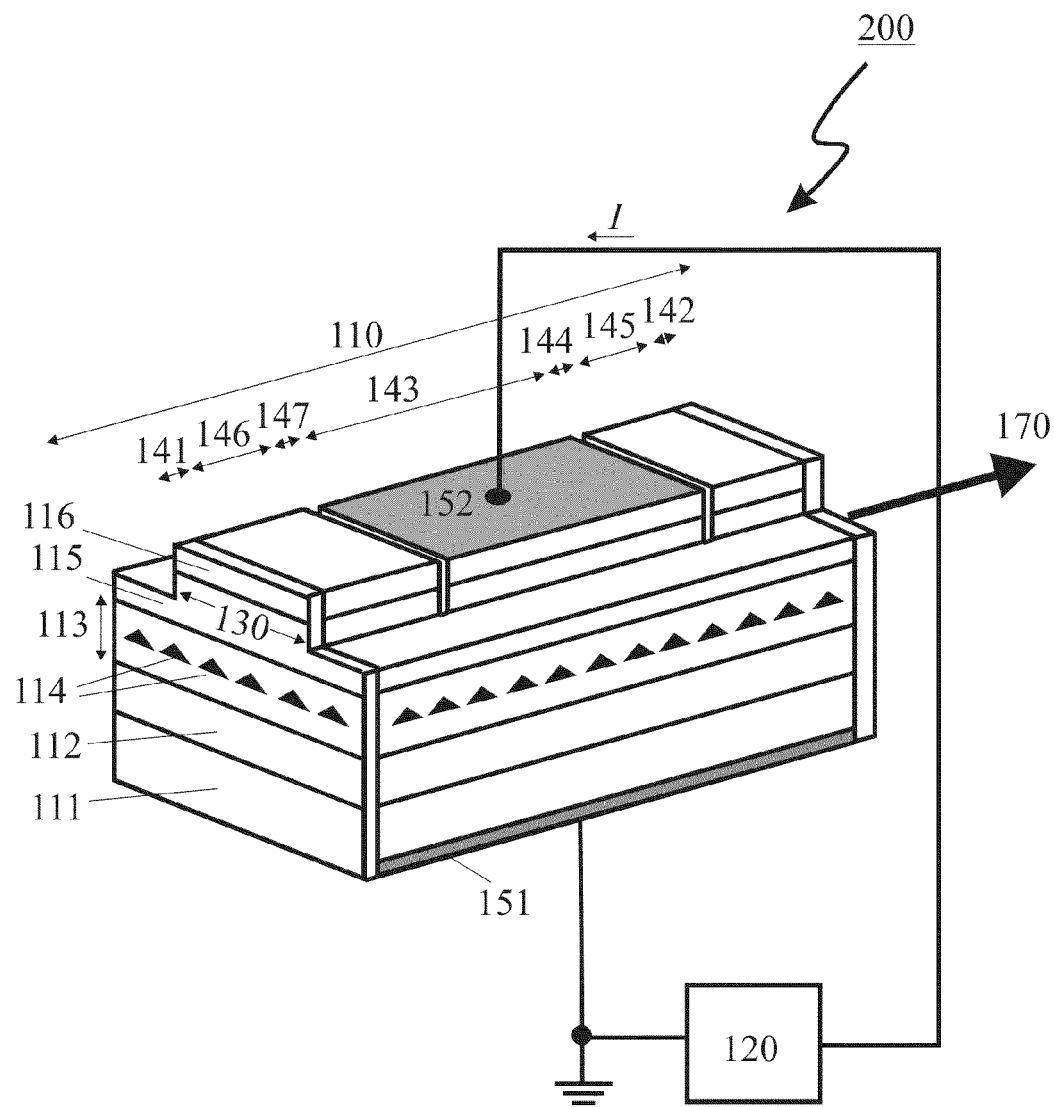
FIG. 5 shows a schematic diagram of a semiconductor laser according to another embodiment of the present invention.

In another embodiment shown in FIG. 5, a laser 200 includes an optical resonator 110 with a first mirror 141, a second mirror 142, an active section 143, a first integrated noise reducing section 145 on one side of the active section 143 and a second noise reducing section 146 on the other side of the active section 143. The active section 143 and the noise reducing sections 145 and 146 are preferably electrically isolated by trenches 144 and 147, respectively. An n-ohmic contact 151 is formed on the substrate 111 and a p-ohmic contact 152 is formed on the contact layer 116. The p-ohmic contact is preferably not formed on the noise reducing sections 145 and 146.

If it is preferable from a fabrication viewpoint and to simplify post-growth processing, the p-ohmic contact 152 can be deposited on the noise reducing sections 145 and 146 but, in this case, the noise reducing sections 145 and 146 should be electrically isolated from the active section 143. The isolation is preferably formed at the p-contact side of the laser 200. The active section 143 and noise reducing sections 145 and 146 may be isolated from each other by trenches 144 and 147 through the p-ohmic contact 152, the contact layer 116 and a top part of the second cladding layer 115.

In the laser 200 shown in FIG. 5, the total length of the optical resonator 110 is preferably from 0.3 to 10 mm. The sum of the lengths of the noise reducing sections 145 and 146 is preferably about 5-30% of the total length of the optical resonator.

Figure 6:
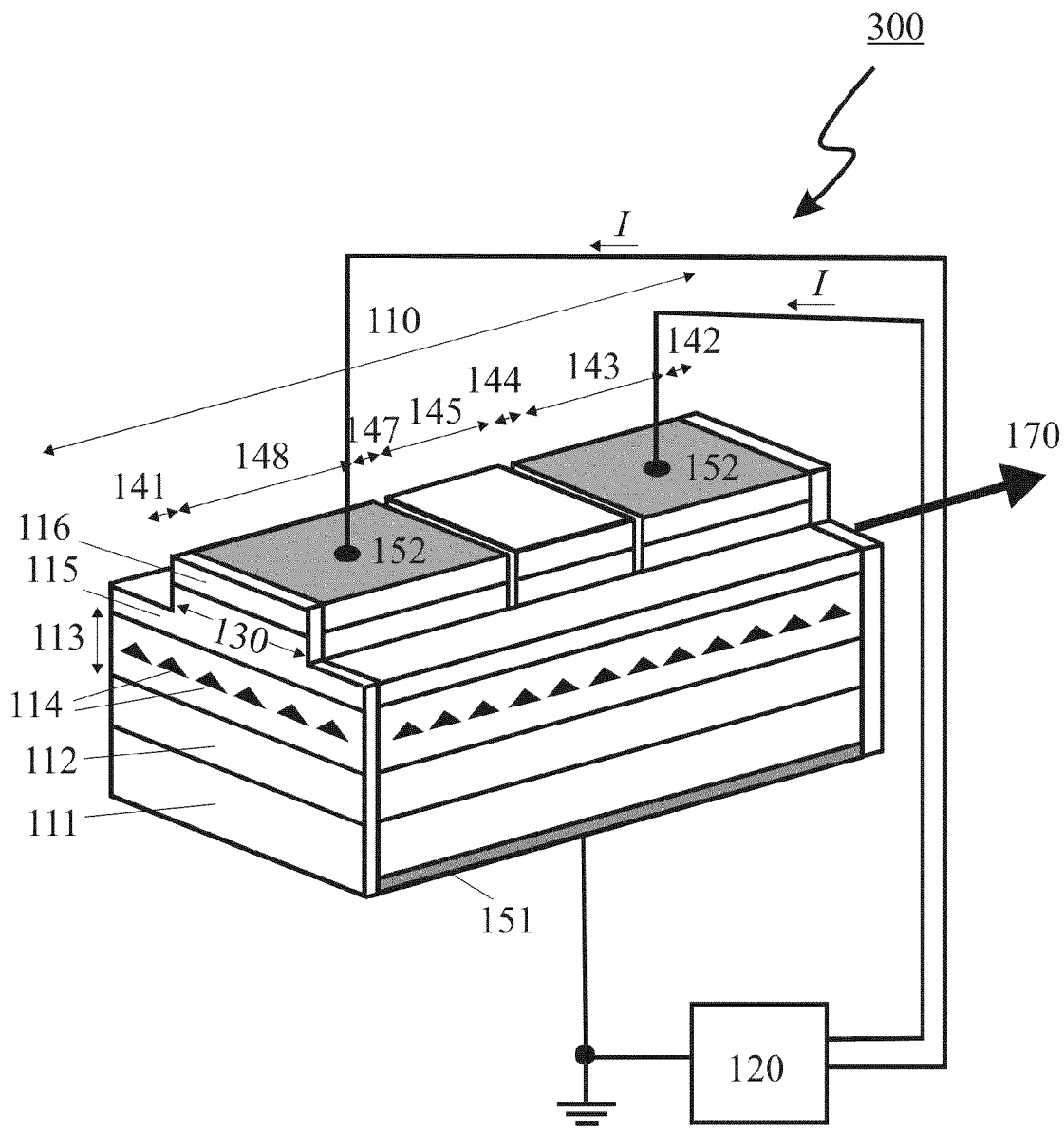
FIG. 6 shows a schematic diagram of a semiconductor laser according to another embodiment of the present invention.

FIG. 6 shows a laser 300 where the active section includes two parts 143 and 148 and the noise reducing section 145 is located between the two parts 143 and 148 of the active section. The left part 148 of the active section and the right part 143 of the active section are isolated from the noise reducing section 145 by trenches 144 and 147. The current is injected (I) into both parts 143 and 148 of the active section.

In FIGS. 4 through 6, the first mirror 141 and the second mirror 142 of the laser 100, 200, 300 are preferably cleaved facets. The mirrors 141 and 142 may optionally include a dielectric layered structure to modify the facet reflectivity. The reflectivity of the first mirror 141 is preferably greater than 90% and the reflectivity of the second mirror 142 is preferably less than 70%.

The diode laser 100, 200, 300 is connected with electrical driving circuitry 120. The active section is preferably driven by a forward bias to provide optical gain sufficient for lasing. The noise reducing section is preferably not biased.

Figure 7:
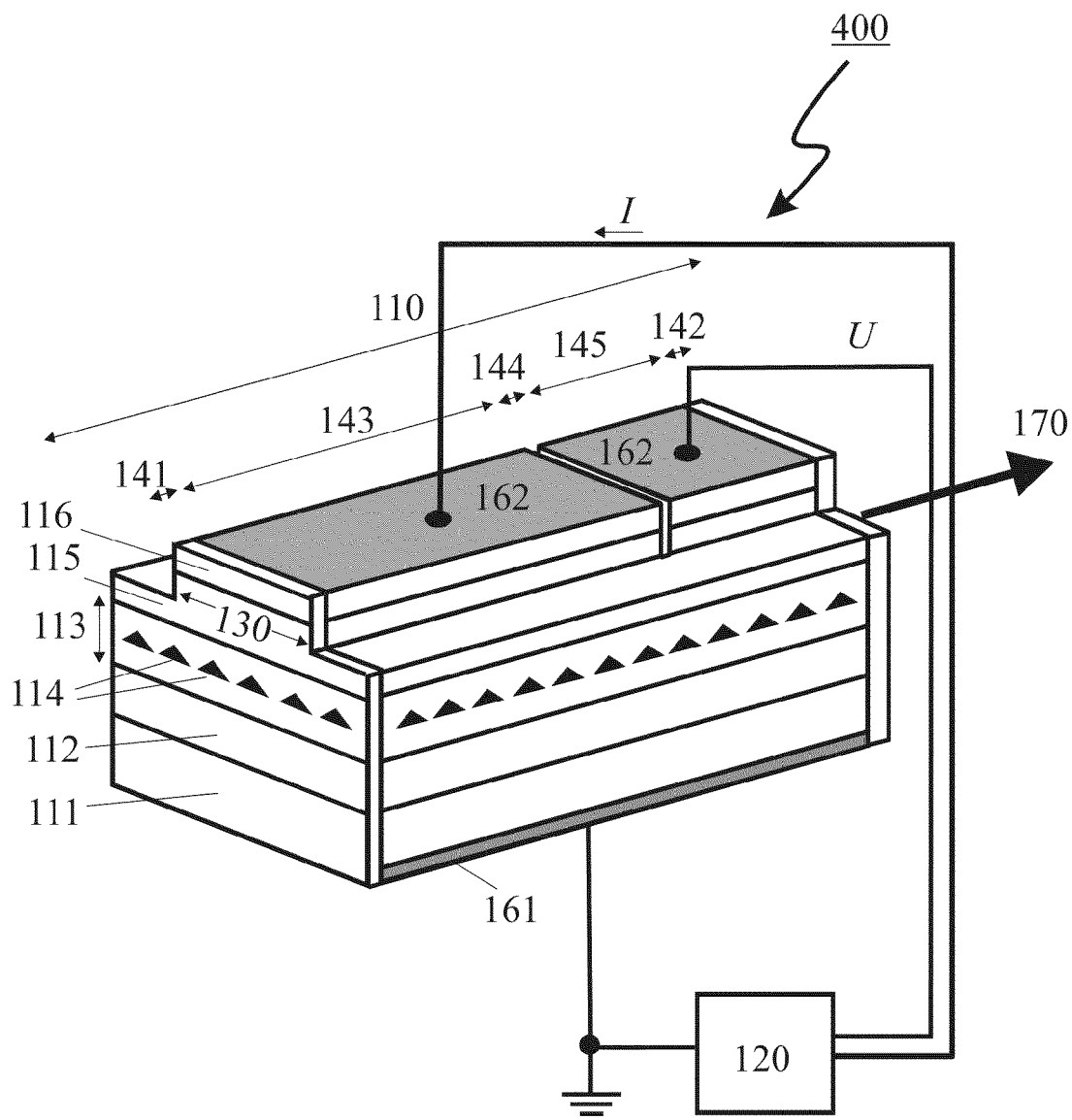
FIG. 7 shows a schematic diagram of a semiconductor laser according to another embodiment of the present invention.

FIG. 7 schematically illustrates a laser diode 400 in accordance with another embodiment of the present invention. A difference between the laser diode 100 and the laser diode 400 is that, in FIG. 7, the contact layer 162 in the laser diode 400 is deposited on top of the noise reducing section 145 and it is reverse biased by a voltage U. An n-ohmic contact 161 is formed on the substrate. As shown below, a certain combination of active section length, noise reducing section length, injection current and voltage U may result in the improvement of RIN of the lasing modes. The laser 400 may be a useful tool in studying the physics of low RIN lasers.

A forward bias can be applied to the noise reducing section 145 of the laser 400. In other words, current can be injected into this section. The density of the current should be less than the density of current injected into the active section. While experimental data show that the performance of the laser diode 400 may be worse than the performance of laser diode 100, the laser diode 400 can still emit a plurality of optical modes, each with low RIN.

Similarly reversed bias or injection current can also be applied to one or two noise reducing sections in lasers 200 and 300 provided a top contact layer is deposited on the noise reducing section.

As mentioned above, a prerequisite for the application of a multi-wavelength light source in DWDM systems is low relative intensity noise of each longitudinal mode (modal RIN). In single frequency lasers with a large side mode suppression ratio (SMSR>40 dB), the values of RIN are rather low and these lasers are suitable for telecommunication applications. In the case of multi mode (multi frequency) lasers, the value of RIN rises significantly (Henry, C. H., Henry, P. S., and Lax, M., "Partition fluctuations in nearly single-longitudinal-mode lasers," J. Lightwave Technol., LT-2, 209 (1984), herein incorporated by reference) and the lasers do not comply with telecommunication applications requirements. The main reason that the relative intensity noise rises in multimode lasers is mode partition noise which is connected with random redistribution of mode intensity between longitudinal laser modes (Schimpe, R., "Theory of intensity noise in semiconductor laser emission", Z. Phys. B—Condensed Matter, 52, 289 (1983)). Thus, spectral division into individual spectral lines in quantum well lasers is possible but it does not allow the realization of error-free data transmission that currently prevents the use of Fabry-Perot lasers in DWDM systems. The other situation is realized for a semiconductor laser with nonlinear gain saturation or, in other words, where relaxation oscillations are strongly dumped. Agrawal, G. P. ("Mode-partition noise and intensity correlation in a two-mode semiconductor laser", Phys. Rev. A, 37, 2488 (1988), herein incorporated by reference) shows that the presence of nonlinear gain saturation leads to a decreased RIN for the fundamental mode of a two-frequency laser. Computational modeling of characteristics of twenty one longitudinal laser modes has shown that strong damping of relaxation oscillations suppresses fluctuation of the photon density in the cavity and considerably decreases the value of RIN (Nguyen, L. V. T., "Mode-partition noise in semiconductor lasers", Defense Science and Technology Organization (Australia) research report DSTO-RR-0244 (2002), herein incorporated by reference). Relaxation oscillations in QD lasers are strongly damped due to large values of the gain compression factor(s). The typical value for the gain compression factor in QD lasers is $5 \times 10^{-16}$ cm$^3$ (Su, H., and Lester, L. F, "Dynamic properties of quantum dot distributed feedback lasers: high speed, linewidth and chirp", J. Phys. D: Appl. Phys. 38, 2112 (2005), Ghosh, S., Pradhan, S., and Bhattacharya, P., "Dynamic characteristics of high-speed $In_{0.4}Ga_{0.6}As/GaAs$ self-organized quantum dot lasers at room temperature", Appl. Phys. Lett., 81, 3055 (2002), herein incorporated by reference). Thus, the gain compression factor for QD lasers is at least one order of magnitude larger than that for quantum well lasers.

For applications in optical telecommunications, particularly for DWDM, it is desirable to increase the number of longitudinal modes with low RIN, decrease the RIN level for each individual mode, and increase the stability of a low RIN lasing regime.

In the present invention, the operation of a low RIN QD laser is improved by using a noise reducing section that provides mode coupling and synchronization. Due to this effect, the mode competition for gain is suppressed. In particular, the coupling of the modes reduces the mode partition noise. Since the modes become coupled, the noise of each mode tracks with the overall very low noise of the total laser output.

The devices of the present invention are not mode-locked lasers with amplitude modulation. One example of a quantum dot mode-locked laser is described in U.S. patent application Ser. No. 11/100,970, filed Apr. 7, 2005, entitled "MODE-LOCKED QUANTUM DOT LASER WITH CONTROLLABLE GAIN PROPERTIES BY MULTIPLE STACKING" and incorporated herein by reference. A mode-locked laser emits short optical pulses. In contrast, the devices of the present invention operate in a nearly continuous wave regime, and only very small intensity modulations are observed.

Figure 8:
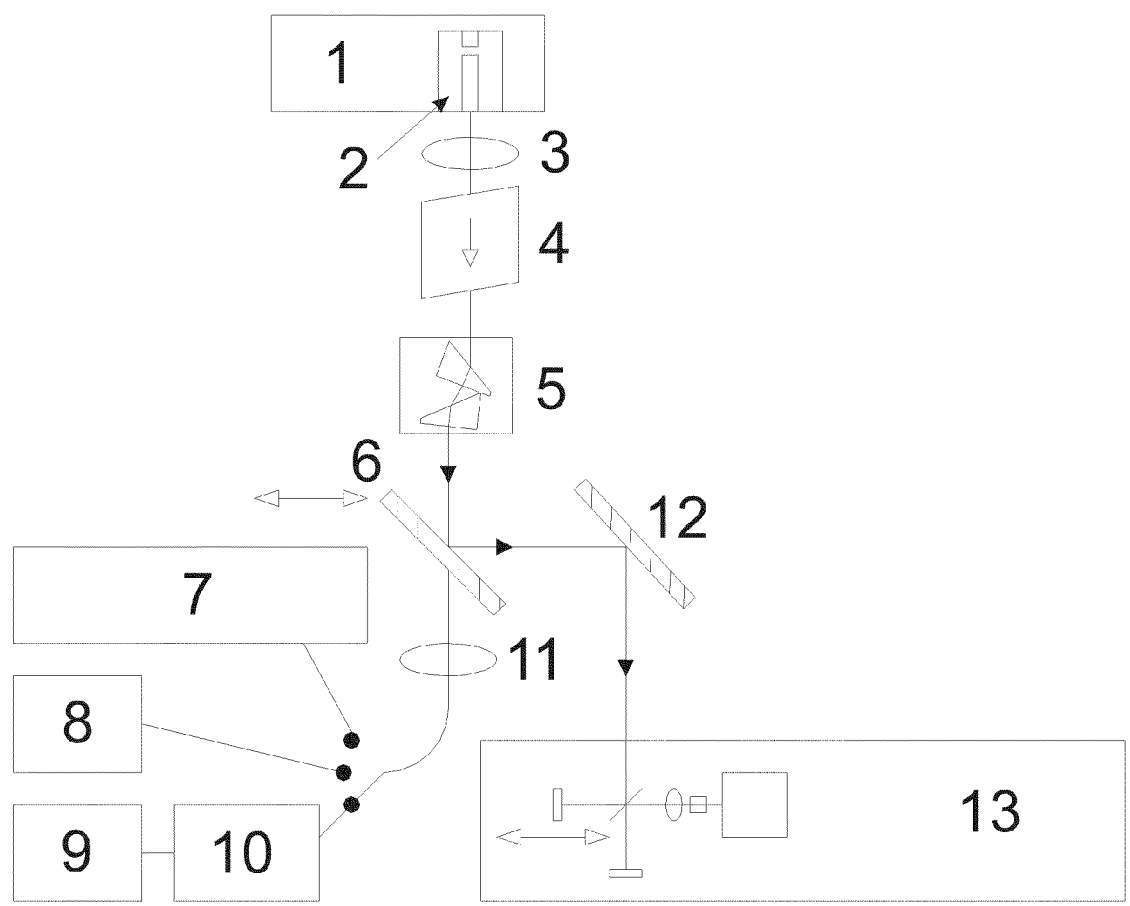
FIG. 8 schematically shows a setup used for intensity autocorrelation studies.

This is confirmed by autocorrelation studies. A setup for autocorrelation measurements is shown in FIG. 8. A low RIN laser 2 is mounted to a heatsink 1. The laser beam is focused by a lens 3, collimated and properly optically isolated by an optical isolator 4. An anamorphic prism pair 5 compensates for the strong beam ellipticity, increases the diffraction gratings resolution and minimizes undesirable diffractive beam divergence. A mirror 6 is movable. If the mirror 6 is removed, the laser beam is focused by a lens 11 and then measured either by a power meter 7, by an optical spectrum analyzer 8, or by a high speed photodiode 10 with an amplifier 9. Alternatively, the mirror 6 can reflect light to a second mirror 12 which, in turn, directs the beam to a background-free second harmonic generation autocorrelator 13.

Figure 9:
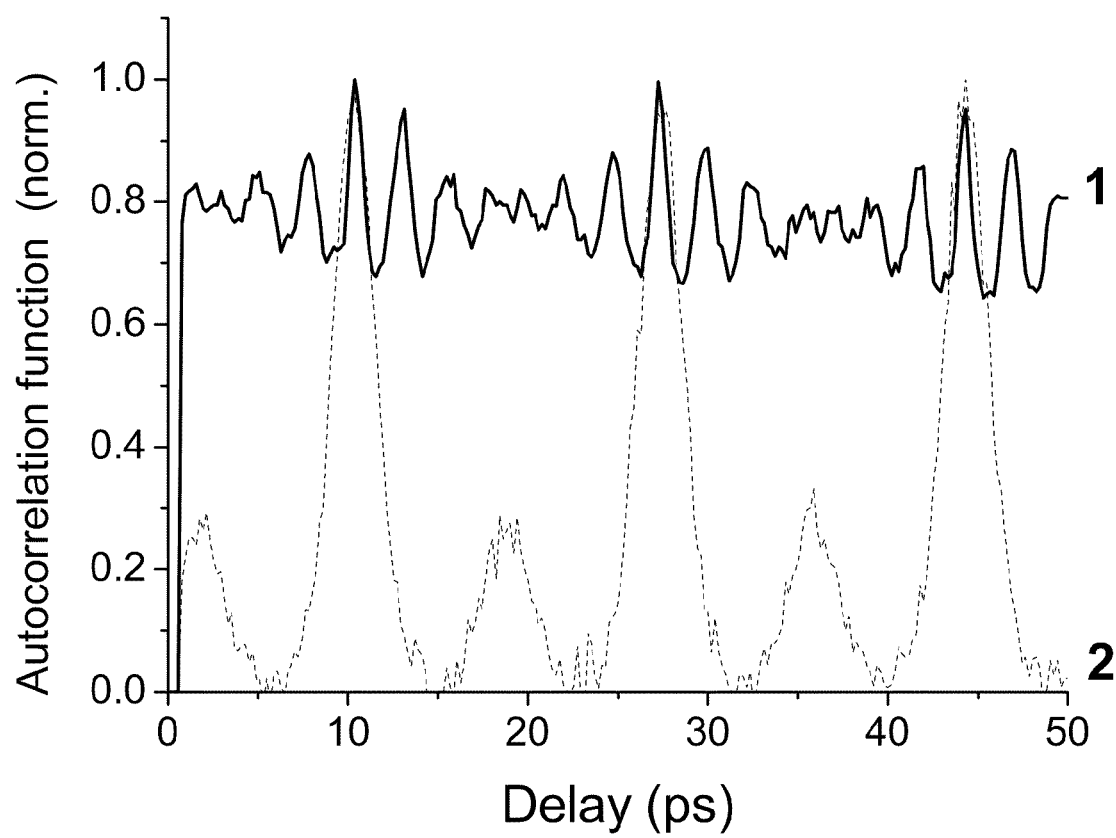
FIG. 9 shows results of intensity autocorrelation studies at low RIN mode compared to a standard amplitude modulation mode-locking mode.

The measured background-free autocorrelation traces for a low-RIN laser are presented in FIG. 9. The sample represents a single spatial mode Fabry-Perot 10-layer QD laser with a cavity length of 690 µm and a noise reducing section length of 100 µm. The front mirror is as cleaved. The back mirror coating provides more than 99% reflection level. In a low-RIN lasing regime, when the pumping current is higher than 150 mA and no reverse bias is applied to the noise reducing section, the autocorrelation function is flat-like and the temporal intensity modulation of output power is below 30% (FIG. 9, curve 1). Neither short pulses nor coherence spikes typical for amplitude mode-locking are observed. Small oscillations of intensity autocorrelation function indicate that the phases of the longitudinal modes are not random. Some kind of mode coupling takes place, but the dependence of the initial phase on the mode number is definitely not linear, unlike the case of amplitude modulation mode-locking. If the reverse bias exceeds 4 V and the gain section pumping is less than 100 mA, the laser starts operating in a standard mode-locking regime. Pulses with 4 ps duration are observed in this case (FIG. 9, curve 2). In a preferred embodiment, the intensity modulation between at least ten optical modes in the laser of the present invention is less than 30%.

The devices of the present invention also differ from monolithic semiconductor mode locked lasers in design. The design of a monolithic semiconductor mode locked laser includes a reverse biased passive section to which a sufficiently high bias voltage is applied. In contrast, a reverse bias is not applied to the noise reducing sections of the lasers of the present invention and it is not necessary in all embodiments to deposit electrical contacts on the noise reducing sections (lasers 100, 200, 300). In some cases, a small bias can be optionally applied to the noise reducing sections (laser 400), but its value should be smaller than the one required for amplitude mode locked operation. The noise reducing sections are not ion implanted like in certain classes of mode locked lasers.

Figure 10:
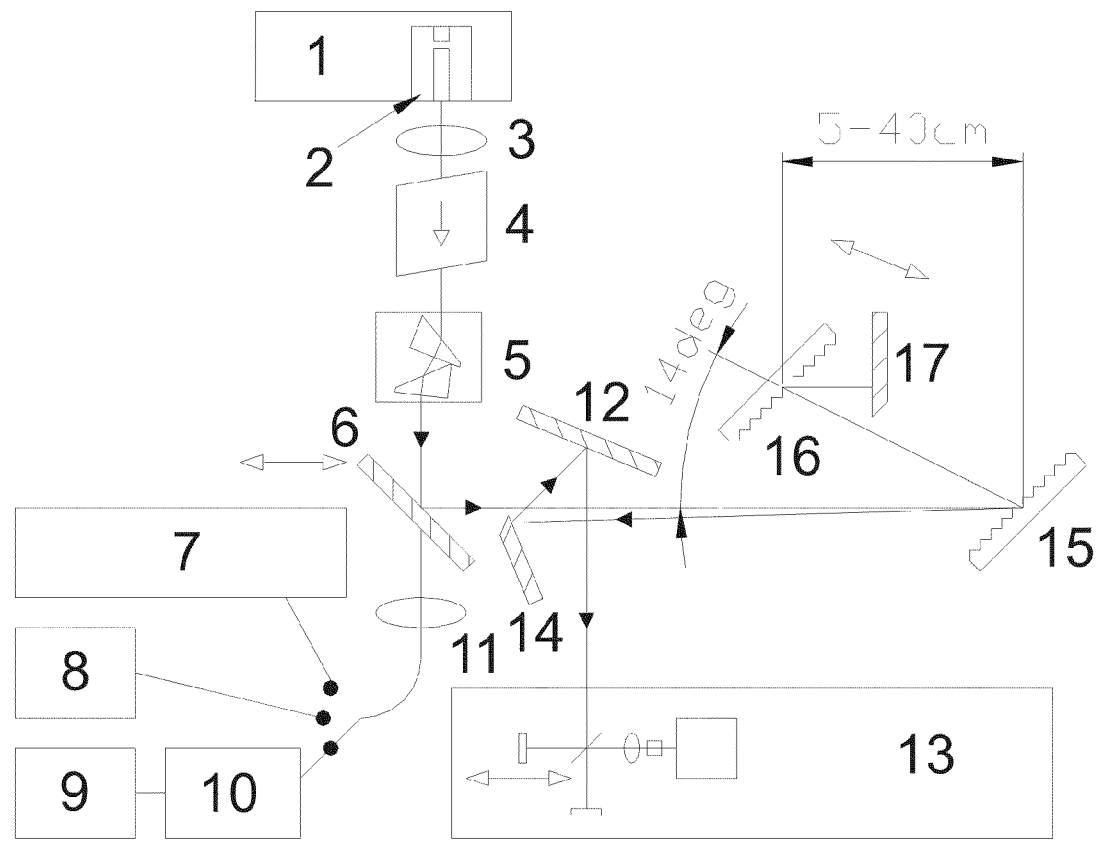
FIG. 10 schematically shows another setup used for intensity autocorrelation studies where different values of anomalous chromatic dispersion are introduced by varying a distance between a grating pair.

Phase correlation between longitudinal modes takes place quantum well devices due to mode interaction via four-wave mixing (A. P. Bogatov, P. G. Eliseev, and B. N. Sverdlov, "Anomalous interaction of spectral modes in a semiconductor laser," IEEE J. Quantum Electron., vol. 11, no. 7, pp. 510-515, July 1975, herein incorporated by reference). Note that the device studied by Bogatov et. al. did not include a noise reducing section and RIN was not measured. No studies similar to those as described in the paper by Bogatov et. al. have been done for QD lasers. However, four-wave mixing should occur in quantum-dot lasers as well and its strength should be even enhanced relative to quantum well lasers. An increased gain compression factor caused by the photon bottleneck effect and suppressed carrier lateral transport are responsible for enhanced strength of four-wave mixing, which results in phase correlation between longitudinal modes in QD lasers. This consideration is supported by the autocorrelation measurements with anomalous chromatic dispersion. A schematic of an experimental setup used for these studies is presented in FIG. 10. The elements of the setup shown in FIG. 10, which correspond to the same elements of the setup shown in FIG. 8, are indicated by the same reference numerals and have the same function. The laser beam reflected from the mirror 6 falls on a first grating 15, then it falls on a second grating 16. After that, it is reflected back at a small angle by a mirror 17. The grating pair 15, 16 operates as a medium with anomalous chromatic dispersion (regulated by the distance between the grating that preferably varies from 5 to 40 cm) and mixes the frequency and intensity modulation. The double-pass scheme is applied for spatial dispersion elimination. The dispersion level can be easily regulated by the distance between the gratings. For calibration, the setup shown in FIG. 10 was used. Mirrors 12, 14 are used to direct the beam to a background-free second harmonic generation autocorrelator 13 that measures the intensity-correlation profile.

Figure 11:
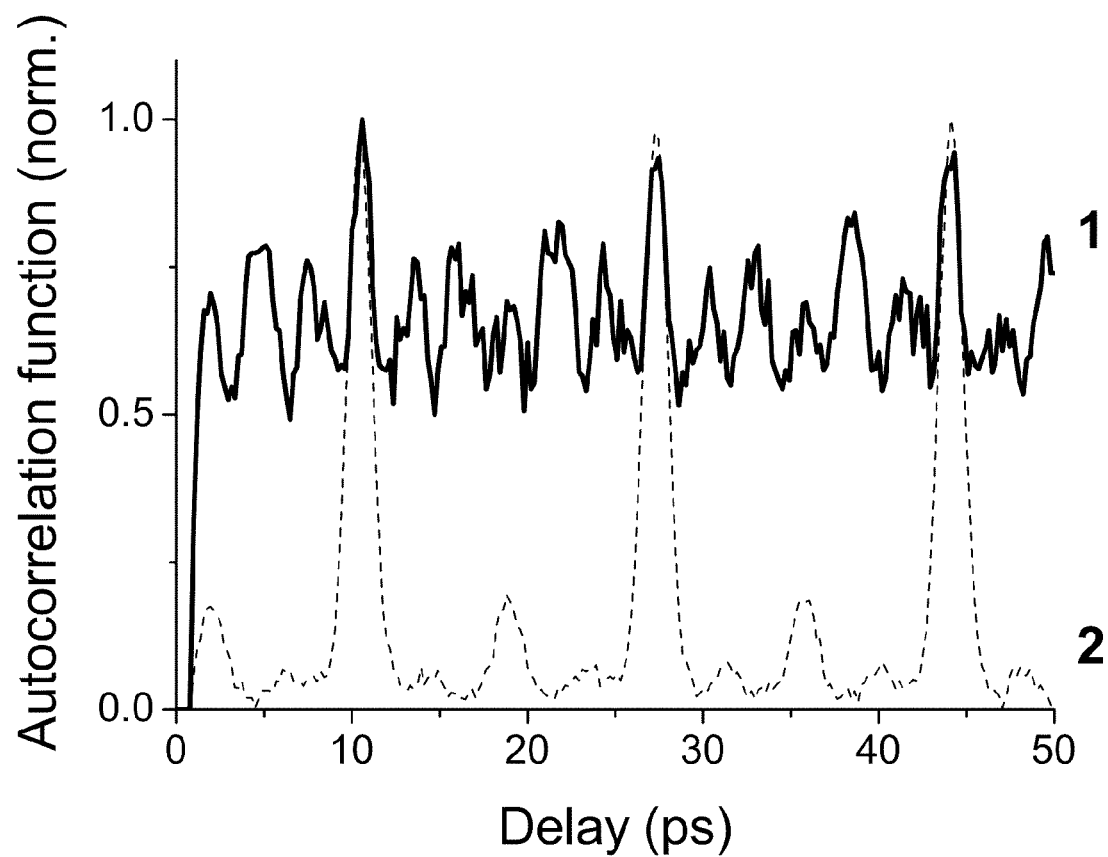
FIG. 11 shows results of intensity autocorrelation studies after the effect of anomalous chromatic dispersion.

The auto-correlation traces measured at 25° C. are shown in FIG. 11. The injection current is 170 mA, and no voltage is applied to the noise reducing section. The autocorrelation traces were measured at different distances between gratings 15 and 16. Each distance corresponds to a certain value of anomalous dispersion. The auto-correlation traces show a pronounced intensity modulation. The shortest pulses of about 1 ps are demonstrated at 15 cm distance between the gratings (FIG. 11, curve 1). The pulse width is much shorter compared to the cavity round-trip time of 17 ps. That means that the regular linear frequency up-chirping predominates in the original laser radiation. Correspondingly, at a two-times longer distance of 30 cm between the gratings (FIG. 11, curve 2), the amplitude modulation is small again.

The parallel current injection into both sections as well as analogous experiments with the single-section lasers demonstrate that mode coupling can take place even without the noise reducing section and certain single-section QD lasers show low RIN of individual FP modes as described in U.S. patent application Ser. No. 11/938,472. However, according to experimental data, the regime of mode-coupling is unstable; there is considerable dispersion of the individual mode noise from sample to sample and a strong dependence of the RIN level on the temperature and pumping current.

The use of a noise reducing section significantly improves the operation of a low RIN laser in several ways, including, but not limited to: (i) the number of longitudinal modes having low RIN is increased; (ii) their RIN level is decreased; and (iii) the range of injection current in which low RIN operation takes place is increased.

Although the RIN of the lasers 100, 200, 300 and 400 in the embodiments shown in FIGS. 4-7 is sufficiently low for error-free data transmission, alternative embodiments further improve the laser RIN.

Figure 12:
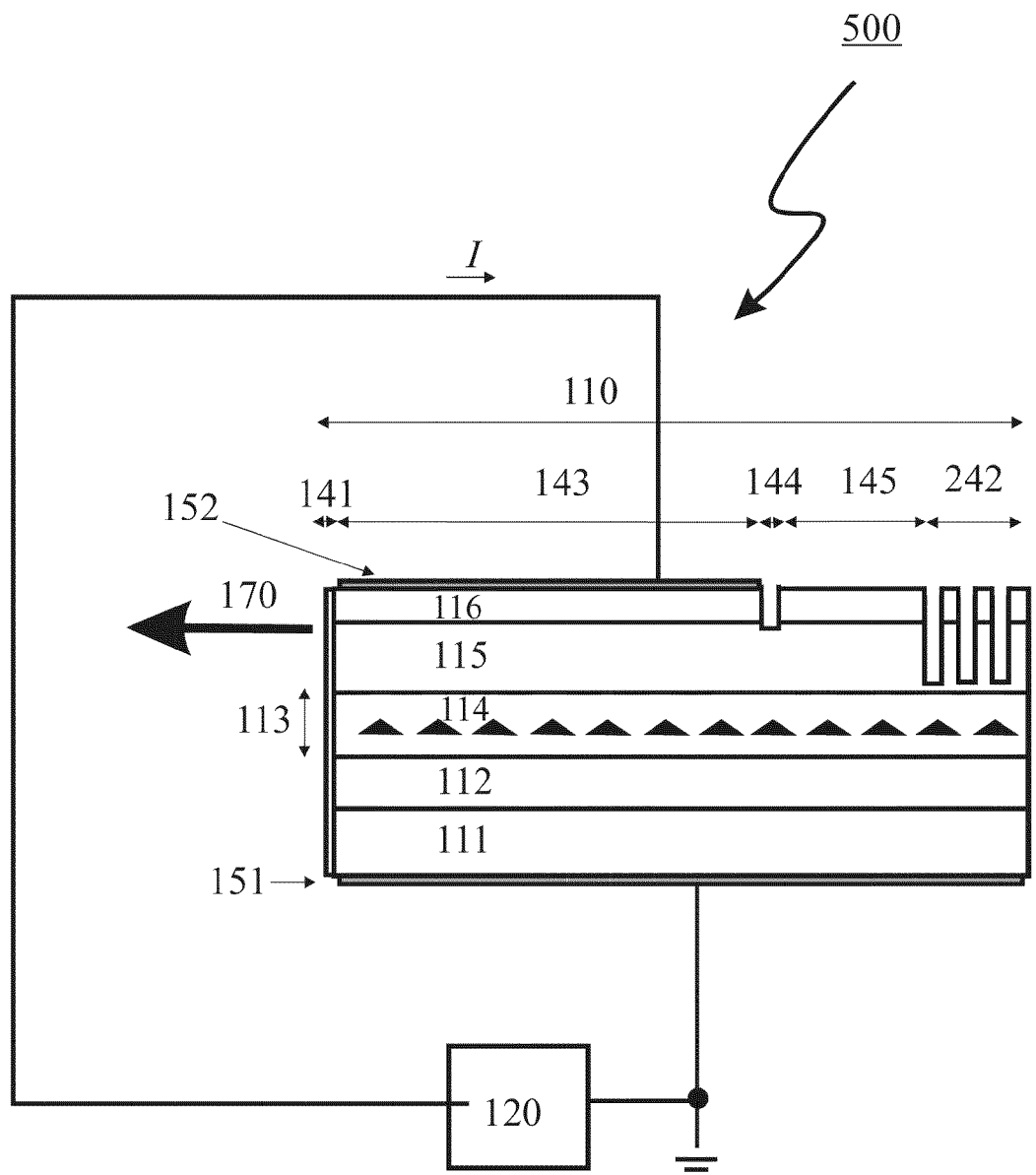
FIG. 12 shows a schematic diagram of a semiconductor laser according to another embodiment of the present invention.

In another embodiment of the present invention, at least one mirror of the laser is capable of restricting the laser emission spectrum to a pre-selected bandwidth, which is narrower than an optical gain spectrum of the laser's active region. FIG. 12 schematically illustrates a laser diode 500 in accordance with this embodiment, where the second mirror is capable of restricting the laser emission spectrum. Elements of the source 500, which correspond to the same elements of the source 100, are indicated by the same reference numerals.

One difference between the source 100 and the source 500 is that the second mirror 242 of the laser 500 is capable of restricting the laser emission spectrum to a pre-selected bandwidth being narrower than an optical gain spectrum of the laser's active region. The second mirror 242 is preferably a first-order distributed Bragg reflector (DBR) formed by approximately periodic etching through the contact layer 116 and part of the second cladding layer 115. The depth of the etching determines the optical contrast (effective contrast of the refractive index $\Delta n_{eff}$) of the DBR. In other embodiments, the first mirror is the first-order DBR or both the first mirror and the second mirror are first-order DBRs. One or more mirrors acts as a spectral filter that restricts a width of the emission spectrum to a desired number of optical channels.

Figure 13:
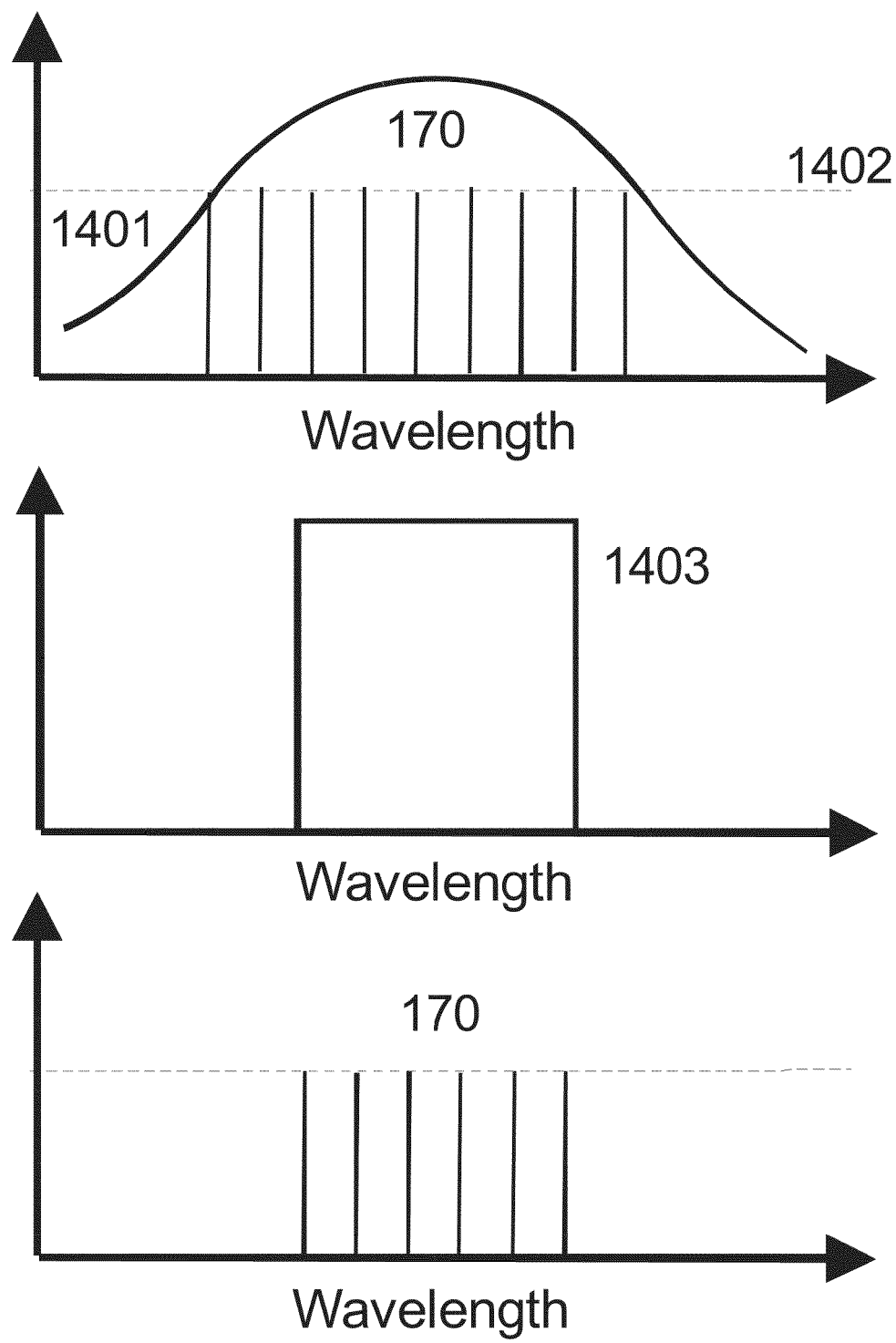
FIG. 13 schematically illustrates restriction of the lasing spectrum by a distributed Bragg reflector (DBR) in the laser shown in FIG. 13.

The restriction of the lasing spectrum to a preselected bandwidth is illustrated in FIG. 13. The laser emits a plurality of optical modes 170 for which gain 1401 exceeds optical losses 1402. A reflectivity spectrum of a DBR 1403 includes a nearly flat-topped reflectivity maximum (known as a DBR's stopband). A spectral position of the reflectivity maximum, and an absolute reflectivity level of the reflectivity maximum are determined by a length of the corresponding DBR, a period of the DBR, and an optical contrast of the DBR. The second mirror 242 is preferably designed such that the spectral width of the reflectivity maximum of the DBR is within the inhomogeneously broadened ground-state optical transition of the quantum dot array. The spectral width of the reflectivity maximum is preferably narrower than the inhomogeneous broadening of the ground-state optical transition of the quantum dot array, and the absolute reflectivity level of the reflectivity maximum is preferably about 90% or higher. In one embodiment, the second mirror 242 is preferably approximately 500 micrometers long and a period of DBR etching is preferably about 180 nanometers. The spectral width of the reflectivity maximum may be about 2.2 nm, which is much narrower than the inhomogeneous broadening of the ground-state optical transition of the quantum dot array. The spectral separation between neighboring wavelengths is preferably about 0.2 nm, such that the laser 500 emits, for example, eleven optical modes at nearly equidistant wavelengths. In one embodiment, the contact layer is not deposited on the noise reducing section. In another embodiment, the contact layer is deposited on the noise reducing section.

Operation of the laser 500 is similar to the operation of lasers 100, 200, 300, 400 such that the laser 500 is capable of providing a plurality of optical signals 170 at nearly equidistant wavelengths, where a relative intensity noise of each of the optical signals is sufficiently low to permit the use of each of the optical signals as an independent data channel. Because the laser emission spectrum is restricted to the narrow bandwidth, the relative intensity noise of longitudinal modes in the laser 500 may be further improved compared to the RIN in the lasers 100, 200, 300, and 400.

Figure 14:
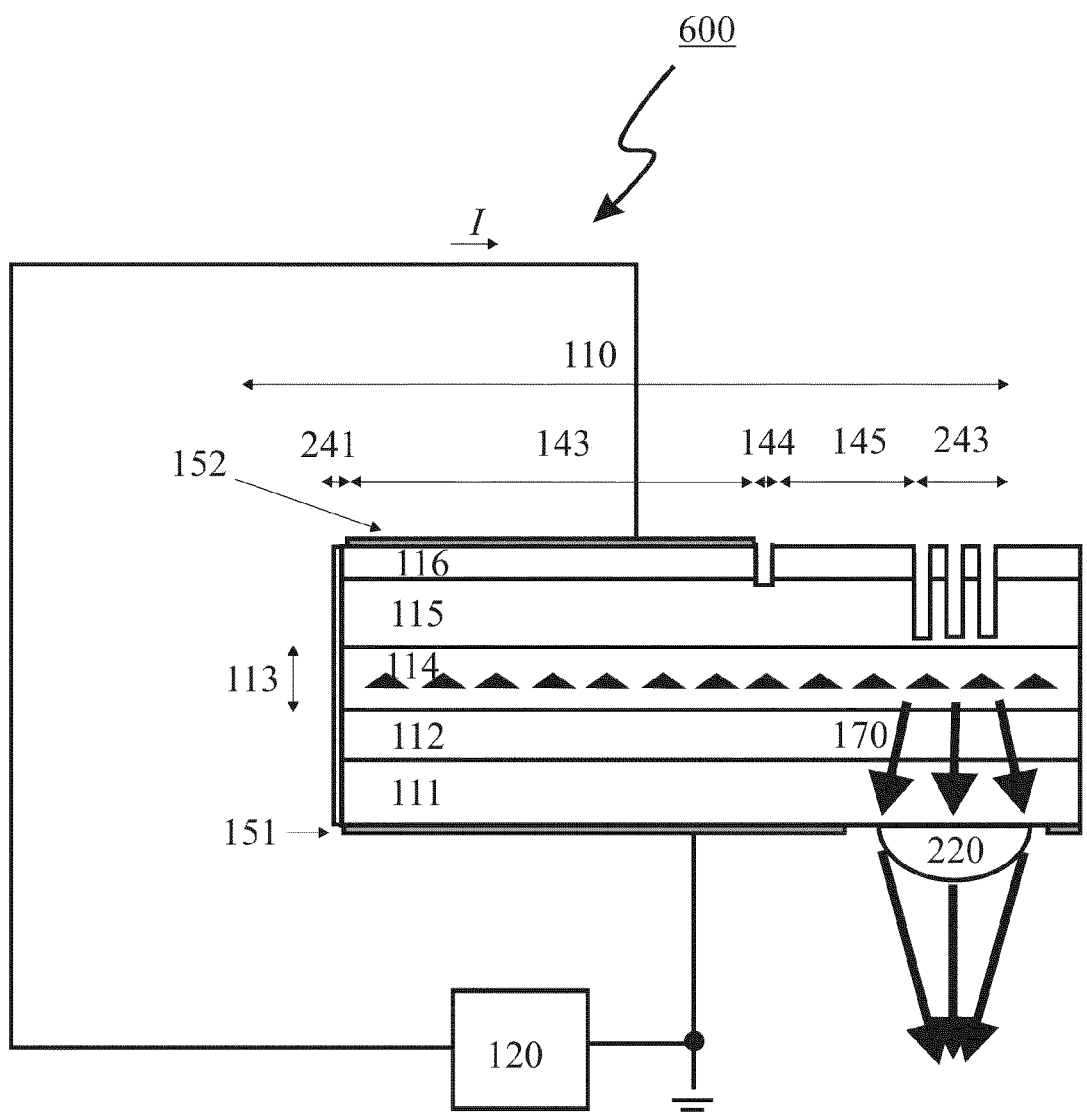
FIG. 14 shows a schematic diagram of a semiconductor laser according to another embodiment of the present invention.

In another preferred embodiment of the present invention, at least one mirror of the laser is a second order DBR mirror. FIG. 14 schematically illustrates a laser diode 600 in accordance with this embodiment, where the second mirror is a second order DBR mirror. A difference between the laser 600 and the laser 100 is that the second mirror of the laser 600 represents a second order DBR mirror 243 instead of the facet second mirror 142. The second-order distributed Bragg reflector is formed by approximately periodic etching through the contact layer 116 and part of the second cladding layer 115. In one embodiment, the second mirror 243 is preferably approximately 15 micrometers long and a period of DBR etching is preferably about 360 nanometers. In other embodiments, the first mirror 241 is a second order DBR mirror or both the first mirror 241 and the second mirror 243 are second order DBR mirrors.

Another difference between the source 100 and the source 600 is that the source 600 further includes a focusing lens 220 monolithically integrated to the laser. The lens 220 is preferably located below the mirror 243 that is a second order DBR mirror. If there are two second order DBR mirrors, there could be a lens below each second order DBR mirror. The lens 220 is preferably formed by etching the substrate 111 material. In one embodiment, the lens diameter is preferably about 30 micrometers and the lens height is preferably about 10 micrometers.

While the optical signals 170 of the lasers 100, 200, 300, 400 and 500 are outputted in a direction parallel to the cavity 110, the optical signals 170 of the source 600 are outputted in a direction perpendicular to the cavity 110. A second-order DBR is capable of re-directing a portion of incoming light in the perpendicular direction. Accordingly, a portion 170 of the laser emission is emitted through the second mirror 243 in a direction perpendicular to the cavity 110. This radiation is then focused when passing through the lens 220. Thus, the optical signals outputted from the laser 600 can be easily and effectively coupled to an external waveguide.

Note that the same epitaxial wafer can be used to fabricate any of the lasers 100, 200, 300, 400, 500, 600. In other words, an epitaxial wafer can be grown that contains certain layers (for example layers 111 through 116, as shown in FIGS. 4-7, 12 and 14) and then be subject to post-growth processing to fabricate any of the lasers 100, 200, 300, 400, 500, 600.

Figure 15:
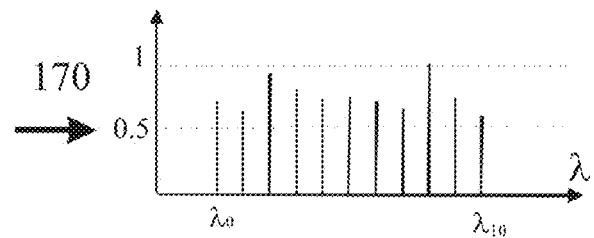
FIG. 15 schematically illustrates a plurality of optical modes emitted by lasers according to the embodiments shown in FIGS. 5, 6, 7, 8, 13 and 15.

The lasers 100, 200, 300, 400 shown in FIGS. 4-7 are capable of emitting a plurality 170 of optical modes at different wavelengths (FIG. 15). Only eleven modes $\lambda_0$-$\lambda_{10}$ are shown but the number of modes can be much higher. In FIGS. 4-7, the spectral positions of the modes are determined by the Fabry-Perot resonator 110 length. Intermodal spacing is described by the well-known equation $$\Delta f = \frac{c/n}{2L},$$

where L is the length of optical resonator 110, c is the speed of light and n is the efficient refractive index. In lasers 500 and 600, the intermodal spacing is described by the equation $$\Delta f = \frac{c/n}{2L_{effective}},$$

where $L_{effective}=L_1+L_{DBR}$. Here $L_1$ is the sum of the lengths of the active section 143 and the noise reducing section 145, $$L_{DBR} = \frac{c\tau_{DBR}}{2\Delta n_{effective}},$$

where $\Delta n_{effective}$ is effective contrast of the refractive index of the DBR, and $\tau_{DBR}$ is DBR group delay, $$\tau_{DBR} = \frac{d\varphi}{d\omega}.$$

Here φ is phase of reflected optical wave and ω is the angular optical frequency.

It is preferable that the number of optical modes is larger than 10 and the intensities of the modes differ from each other by less than a factor of 2. This property is provided by a flat gain spectrum of quantum dots. It is preferred that the RIN of optical modes is less than 0.2%, and more preferably less than 0.1%, making them suitable as individual channels in an optical transmission system. A spectral bandwidth of an output lasing spectrum of the laser diode is preferably greater than 5 nm and a spectral power density of the lasers according to embodiment 100 is preferably greater than 2 mW/nm.

More sophisticated designs including multiple active cavities, multiple noise reducing sections, first order DBR gratings, second order DBR gratings, and lenses and based on the embodiments of the lasers 100, 200, 300, 400, 500, 600 shown in the figures are within the spirit of the present invention.

EXAMPLES

In one example, the laser active region represents ten identical planes of self-organized quantum dots. Each quantum dot plane was formed by epitaxial deposition of 0.8 nm-thick InAs insertions covered with $In_{0.15}Ga_{0.85}As$ capping layers and embedded into a GaAs matrix. The laser structure has a 0.44 μm-thick $GaAs/Al_{0.25}Ga_{0.75}As$ waveguide. The laser represents an edge-emitting Fabry-Perot laser in a pigtailed package. A pigtailed package is a standard laser package having an optical fiber for outputting the laser radiation. The epitaxial wafer was processed into ridge lasers. The active section length was 690 μm and the integrated noise reducing section length was varied within the range of 50-150 μm. The front mirror was as cleaved, and a high reflection coating (99% reflectivity) was formed on the back mirror. An important difference between this device and the device described in U.S. patent application Ser. No. 11/938,472 and Gubenko et al. is the noise reducing section.

The device was fabricated by optical lithography and reactive ion etching. The stripe width was 3-5 μm, The n-ohmic contact was AuGe/Ni/Au. The p-ohmic contact was Ti/Pt/Au.

Figure 16:
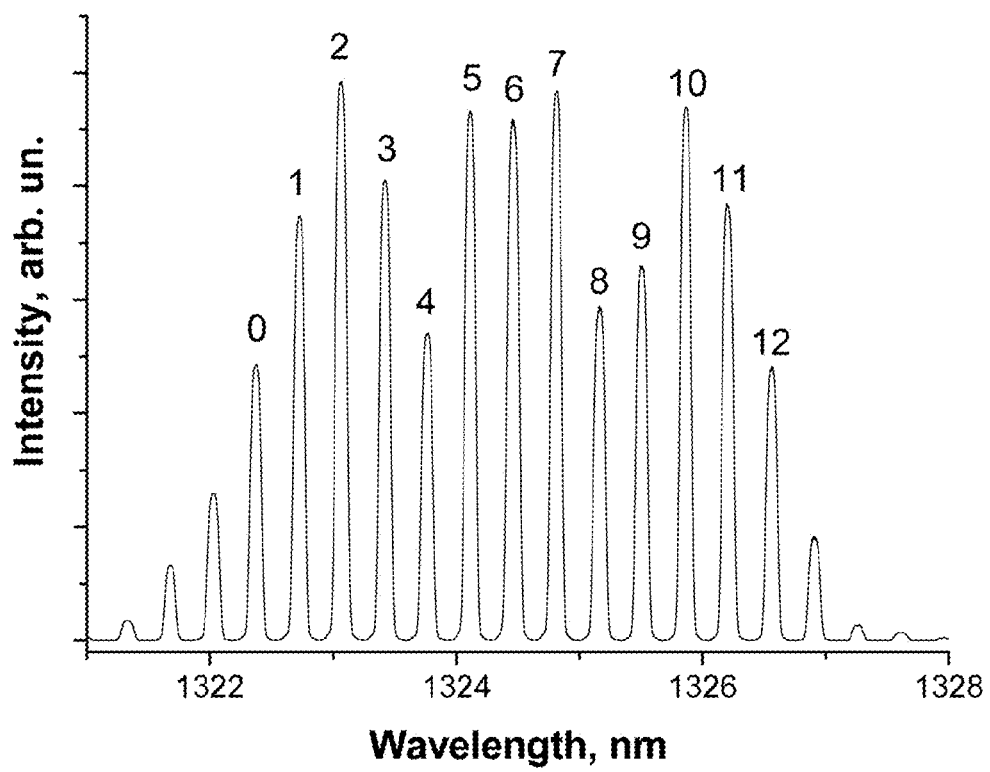
FIG. 16 shows the emission spectrum of a semiconductor laser according to a preferred embodiment of the present invention.
Figure 17:
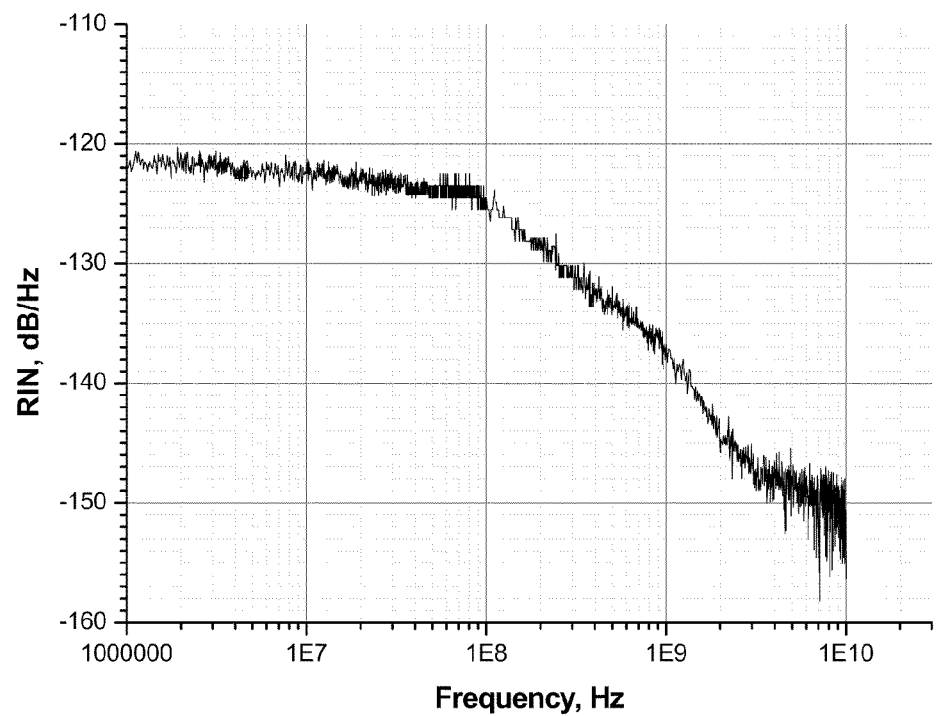
FIG. 17 shows a spectrum of relative intensity noise of filtered modal intensity at 1323.2 nm of a semiconductor laser according to a preferred embodiment of the present invention.

FIG. 16 shows the emission spectrum of the laser in this example. Thirteen optical modes having maximal intensities were numbered from 0 to 12. The spectral interval between the longitudinal modes is 0.32 nm. When the performance of a low RIN laser with a noise reducing section is compared with a laser disclosed in U.S. patent application Ser. No. 11/938,472 and Gubenko et al., it is clear that the noise reducing section improves the laser performance. The RIN of each of these modes was measured in the frequency range of 1 MHz-10 GHz. An example of a RIN spectrum of a laser with a noise reducing section is shown in FIG. 17. In low frequencies, the RIN spectrum is nearly flat at a level of −120 dB/Hz. At higher frequencies, the modal RIN is approximately −125 dB/Hz at 0.1 GHz, −137 dB/Hz at 1.0 GHz and −150 dB/Hz at 10 GHz. These RIN values are better than what is shown in FIG. 3.

Figure 18:
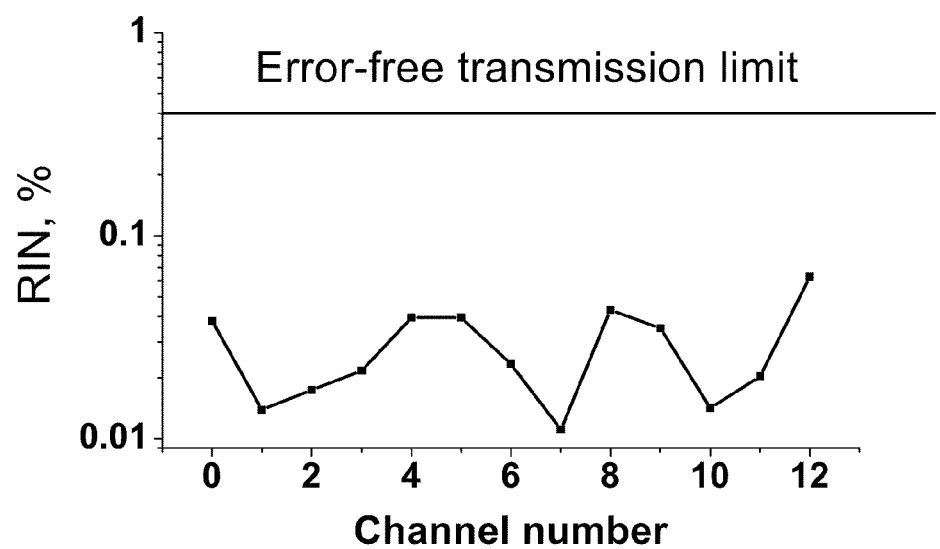
FIG. 18 shows total RIN for modes numbered from 0 to 12 in FIG. 17. Error free transmission level is also shown.

FIG. 18 shows the total RIN for all modes 0-12. The RIN of each mode is much lower than the error-free transmission limit of 0.4%. Mode number 12 has a RIN of 0.06%, the highest RIN of all of the modes. This value is still significantly lower than the value of 0.21% reported in Gubenko et al. and disclosed in U.S. patent application Ser. No. 11/938,472. Some modes show noise as low as 0.01%. In addition, the number of modes having low RIN is larger than in Gubenko et al. and U.S. patent application Ser. No. 11/938,472: 13 versus 10. These results show that the noise reducing section results in a significant decrease in the RIN level of individual modes compared to devices without a noise reducing section. In addition, the noise reducing section leads to an increase in the number of modes having low RIN which may serve as individual channels for an optical transmission system.

To study the effect of the noise reducing section, the performance of a laser with a noise reducing section was compared to a laser without a noise reducing section (the "reference laser") fabricated from the same epitaxial wafer. The design of the reference laser is similar to that described in U.S. patent application Ser. No. 11/938,472 and Gubenko et al. The laser with the noise reducing section had an active section length of 690 μm and the integrated noise reducing section length was 75 μm. The reference laser has an active section with a length of 690 μm, but is lacking a noise reducing section.

Figure 19:
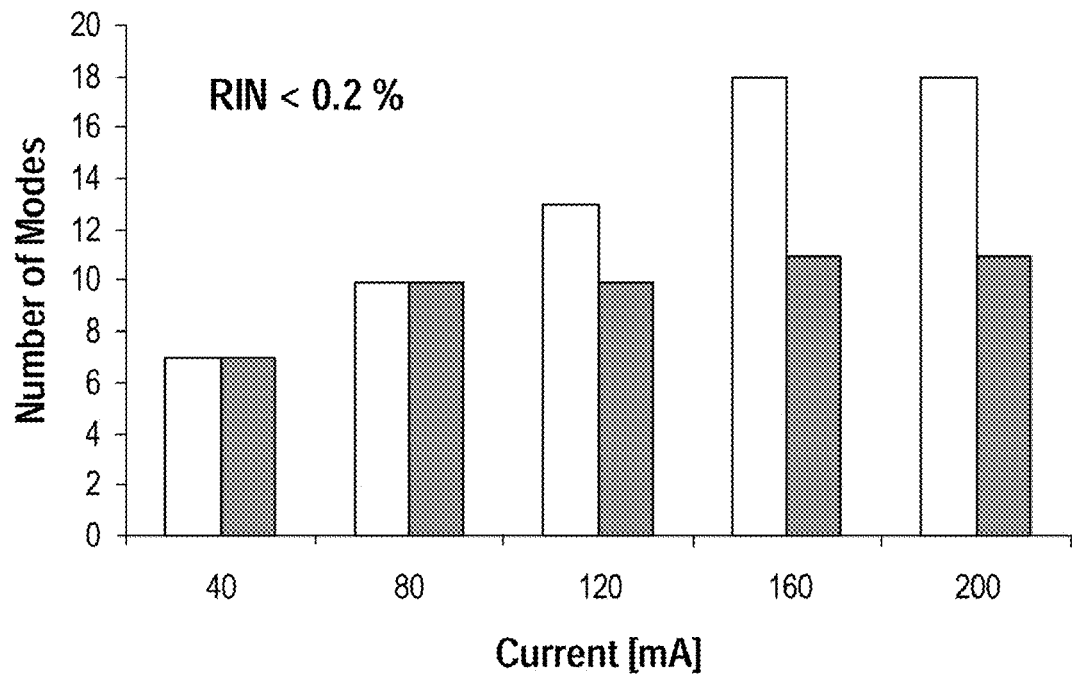
FIG. 19 compares a number of modes for which the RIN is less than 0.2% for the lasers with a noise reducing section (empty bars) with lasers without a noise reducing section (grey bars).

FIG. 19 compares the number of modes having RIN less than 0.2% for a laser with a noise reducing section (empty bars) with the reference laser (grey bars). If the injection current is equal to 80 mA, the laser with a noise reducing section and the reference laser both emit 10 modes having RIN<0.2%. The value for the reference laser corresponds to the results from U.S. patent application Ser. No. 11/938,472 and Gubenko et al., which showed 10 modes with RIN<0.21%. For injection currents 120, 160 and 200 mA, a laser with a noise reducing section emits 13, 18 and 18 modes with RIN<0.2%, respectively. In contrast, the reference laser under injection currents 120, 160 and 200 mA emits only 10, 11 and 11 modes with RIN<0.2%, respectively. Thus, if values of the injection current applied to the active section are higher than 80 mA, the lasers of the present invention always emit a larger number of modes with RIN<0.2% compared to the reference lasers. Therefore, the use of a noise reducing section increases the number of optical modes suitable as independent transmission channels.

Figure 20:
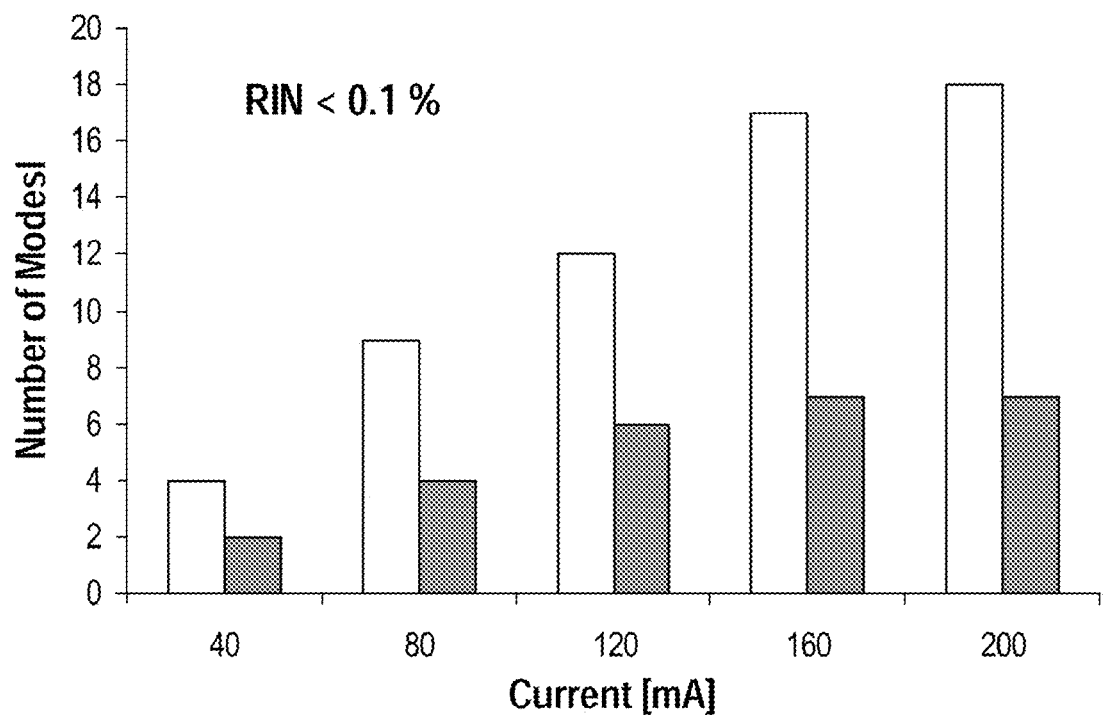
FIG. 20 compares a number of modes for which the RIN is less than 0.1% for the lasers with a noise reducing section (empty bars) with lasers without a noise reducing section (grey bars).

FIG. 20 compares the number of modes having RIN less than 0.1% for a laser with a noise reducing section (empty bars) and the reference laser (grey bars). For an injection current of 40 mA, the reference laser emits 2 modes with RIN<0.1%, while the laser with the noise reducing section emits 4 modes with RIN<0.1%. At an injection current of 80 mA, the reference laser emits 4 modes with RIN<0.1% and the laser with the noise reducing section emits 9 modes with RIN<0.1%. For injection currents 120, 160 and 200 mA, the laser with a noise reducing section emits 12, 17 and 18 modes with RIN<0.1%, respectively. In contrast, the reference laser under injection currents 120, 160 and 200 mA emits only 6, 7 and 7 modes with RIN<0.1%, respectively. At all injection currents, the laser with the noise reducing section emits more than two times the number of modes with RIN<0.1% than the reference laser. Thus, the advantage of using a noise reducing section is especially important if a very low noise level of individual modes is required.

Figure 21:
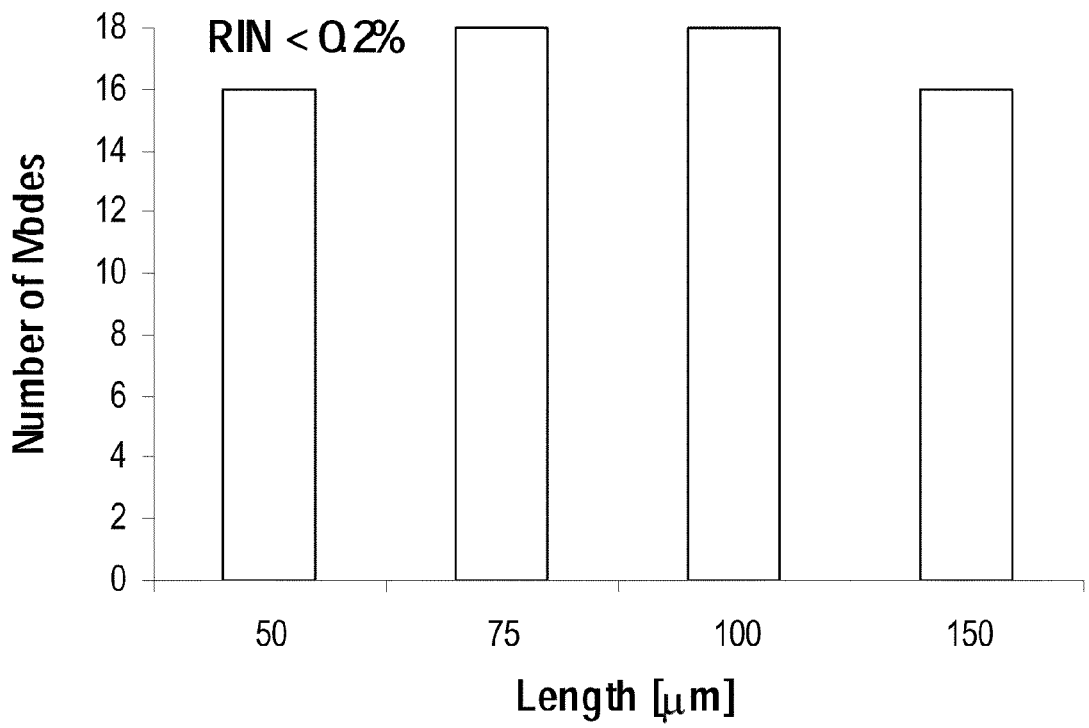
FIG. 21 shows the dependence of number of modes for which the RIN is less than 0.2% on the length of the noise reduction section for a semiconductor laser according to a preferred embodiment of the present invention.

A very important issue is optimization of the length of the noise reducing section. FIG. 21 shows the dependence of the number of modes having RIN less than 0.2% on the active section length if injection current via the active section is 160 mA and active section length is 690 μm. If the noise reducing section length is equal to 50 μm, there are 16 channels having RIN<0.2%. With an increase in the noise reducing section length up to 75 μm, the number of channels with RIN<0.2% increases up to 18. Then, it does not change when the length of the noise reducing section further increases up to 100 μm. For a longer noise reducing section (150 μm), the number of channels with RIN<0.2% decreases to 16. Thus, there is an optimal value for the length of the noise reducing section that depends on active section length. In this example, the optimal noise reducing section length is between 75 and 100 μm.

Figure 22:
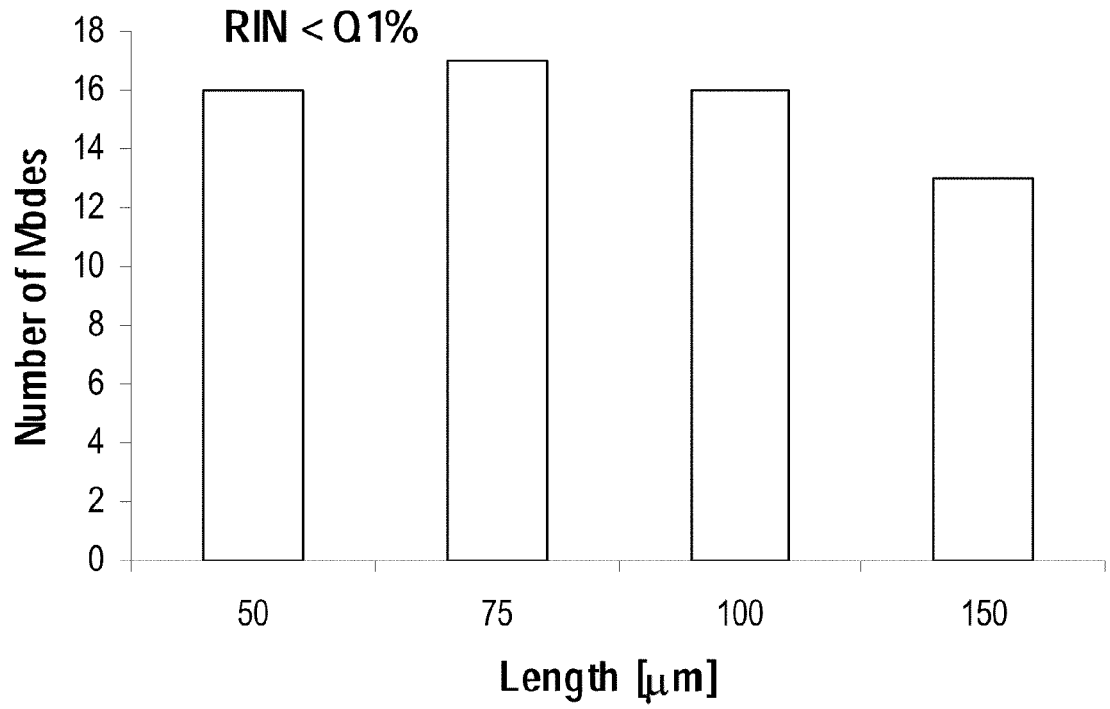
FIG. 22 shows the dependence of the number of modes for which the RIN is less than 0.1% on the length of the noise reduction section for a semiconductor laser according to a preferred embodiment of the present invention.

This trend is also confirmed by FIG. 22. If the noise reducing section length is 50 μm, the number of optical channels having RIN<0.1% is 16. For a noise reducing section length of 75 μm, the number of channels RIN<0.1% increases up to 18. When the noise reducing section length increases to 100 μm, the number of optical channels slightly decreases to 17. For a noise reducing section length of 150 μm, the number of channels further decreases to 13. These results confirm that the optimal noise reducing section length is between 75 and 100 μm.

Figure 23A:
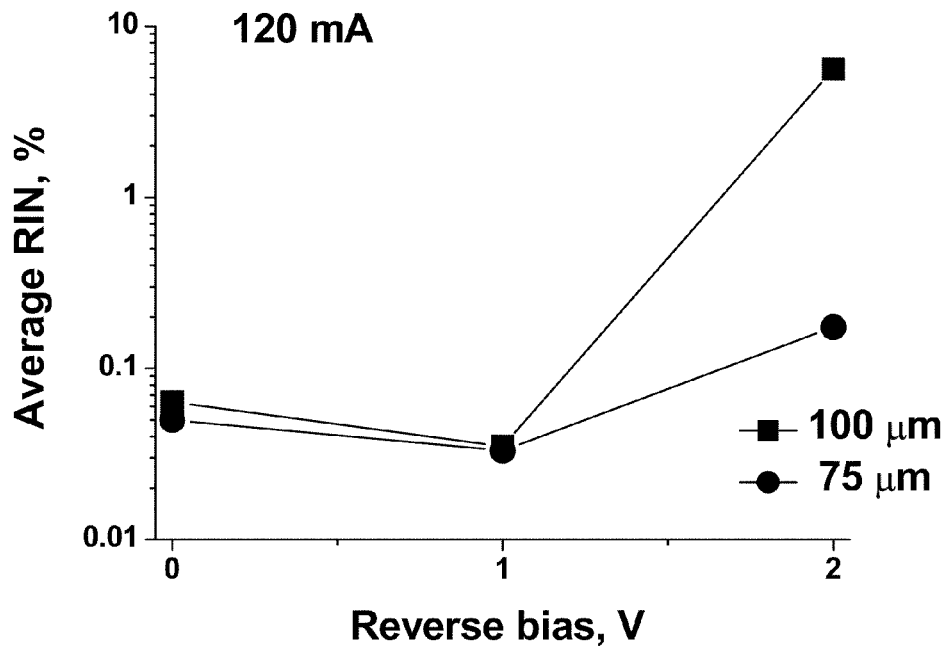
FIG. 23a shows the dependence of average RIN on reverse bias applied to a noise reducing section with an injection current through the active section of 120 mA.
Figure 23B:
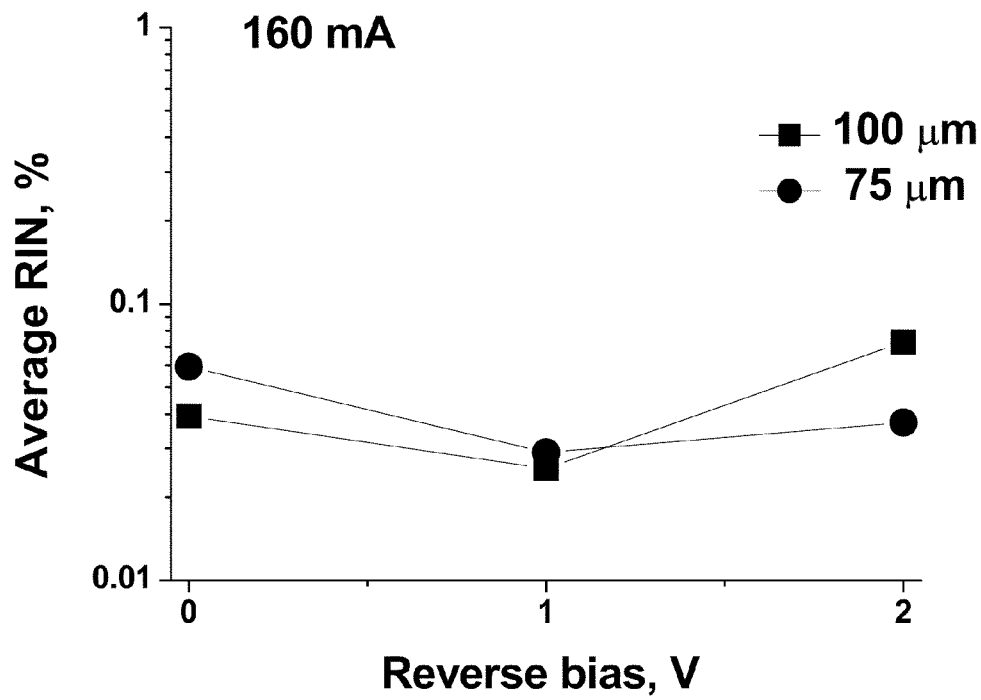
FIG. 23b shows the dependence of average RIN on reverse bias applied to a noise reducing section with an injection current through the active section of 160 mA.

FIG. 23 shows the dependence of average RIN for 13 optical modes on reverse bias voltage applied to a noise reducing section for devices with noise reducing section lengths 75 and 100 μm. The average RIN was obtained by independent measurement of RIN for each mode, summing them up and dividing by the number of modes. Devices with noise reducing section lengths of 75 μm (circles) or 100 μm (squares) were studied. FIG. 23a shows the dependence of average RIN on voltage when injection current in the active section is 120 mA. At zero bias voltage, the average RIN is 0.05% for a device with a noise reducing section length of 75 μm (circles) and 0.06% for a device with a noise reducing section length of 100 μm (squares). With an increase in reverse voltage to 1V, the average RIN decreases down to 0.03% for both devices. However, with a further increase in reverse bias voltage to 2V, the average RIN dramatically increases up to 0.17% for a device with a noise reducing section length of 75 μm (circles) and up to 0.56% for a device with a noise reducing section length of 100 μm (squares). At an injection current of 160 mA, the dependence of average RIN on noise reducing section reverse bias shows a similar trend, as shown in FIG. 23b.

Although applying a small reverse bias may reduce modal RIN, the design of the laser 400 is more complicated than that for lasers 100, 200, and 300. The decrease in modal RIN is small. So, for practical applications, the laser designs 100, 200, and 300 are preferable. However, for some special applications and in some specific cases, the laser design 400 may be preferred.

It is emphasized that, in spite of applying reverse bias to the noise reducing section, the devices of the present invention do not operate in an amplitude mode locked regime. This is confirmed by measurements of autocorrelation traces at different absorber biases. An example of these measurements is presented in FIG. 8.

Another example shows a low RIN laser fabricated from a different epitaxial wafer as compared to previous examples. In other words, layers 111 to 116 (see FIG. 4) are different compared to previous examples.

In this example, the laser active region 114 represents five identical planes of self-organized quantum dots. Each quantum dot plane was formed by epitaxial deposition of 0.85 nm-thick InAs insertions covered with $In_{0.16}Ga_{0.84}As$ capping layers and embedded into a GaAs matrix. A p-doped cladding layer and n-doped AlGaAs cladding layer have 80% Al composition and a thickness of 1.2 μm.

Figure 24:
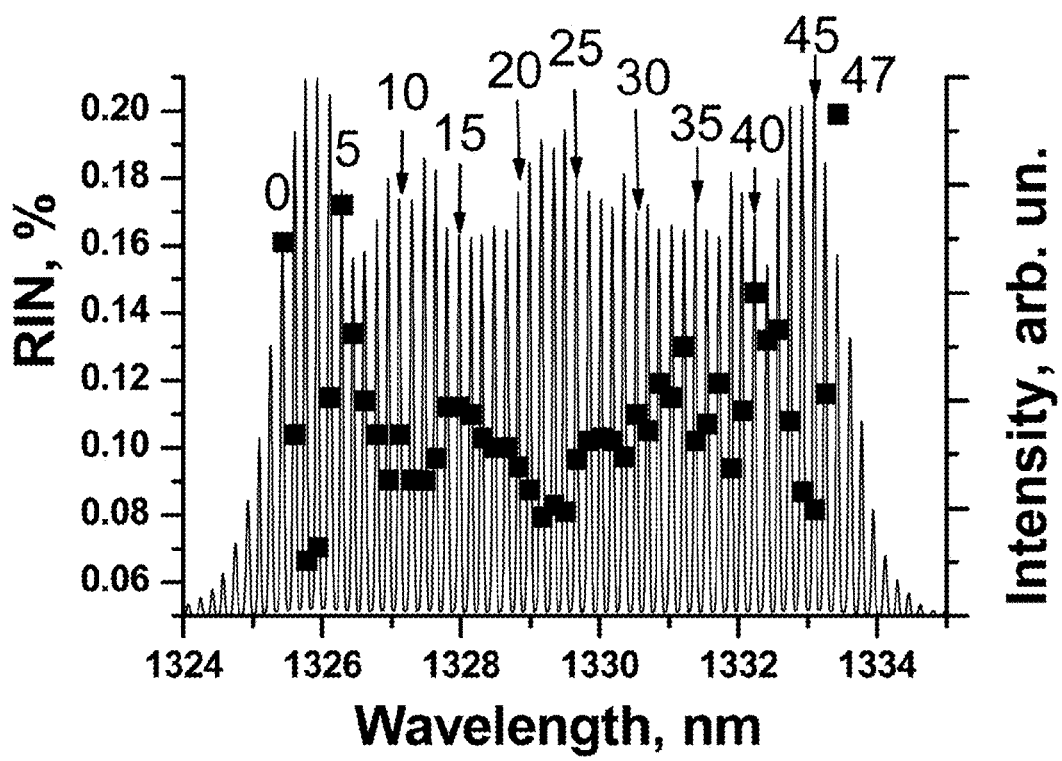
FIG. 24 shows the emission spectrum of a semiconductor laser according to a preferred embodiment of the present invention as well as total RIN for modes numbered from 0 to 47.

Single mode ridge lasers were fabricated by optical lithography and reactive ion etching. The stripe width was 3 μm. The n-ohmic contact was AuGe/Ni/Au. The p-ohmic contact was Ti/Pt/Au. Lasers with an active section length of 1.5 mm, a noise reducing section length of 0.15 mm and as cleaved devices were tested. No dielectric coatings were deposited on the laser facets. The lasers were measured at 25° C. and the current through the active section was 160 mA. A reverse bias of −2V was applied to the noise reducing section. FIG. 24 shows a typical lasing spectrum. The low RIN modes are numbered from 0 to 47. Their intensity distribution is very uniform and varies by only 30%. The spectral distance between the modes is 0.17 nm. The total RIN measured for each individual mode is shown on the same graph. For all 48 modes, the RIN is less than 0.2%, so each mode is suitable as an independent channel for data transmission.

It is possible to control characteristics of low RIN laser by varying parameters of the active area and laser design. Some examples of parameters of the active area that may be varied include, but are not limited to, the number of quantum dot layers, quantum dot density, quantum dot size, and size dispersion. Some examples of design characteristics that could be varied include, but are not limited to, the length of the active section, the length of the noise reducing section, and mirror reflectivity.

Each individual Fabry-Perot mode of the lasers 100, 200, 300, 400, 500, and 600 shown in FIGS. 4, 5, 6, 7, 12, and 14, respectively, has total relative intensity noise below an error free transmission limit (0.4%). Therefore, individual Fabry-Perot modes can be used as independent optical signals in an optical transmission system.

Figure 25:
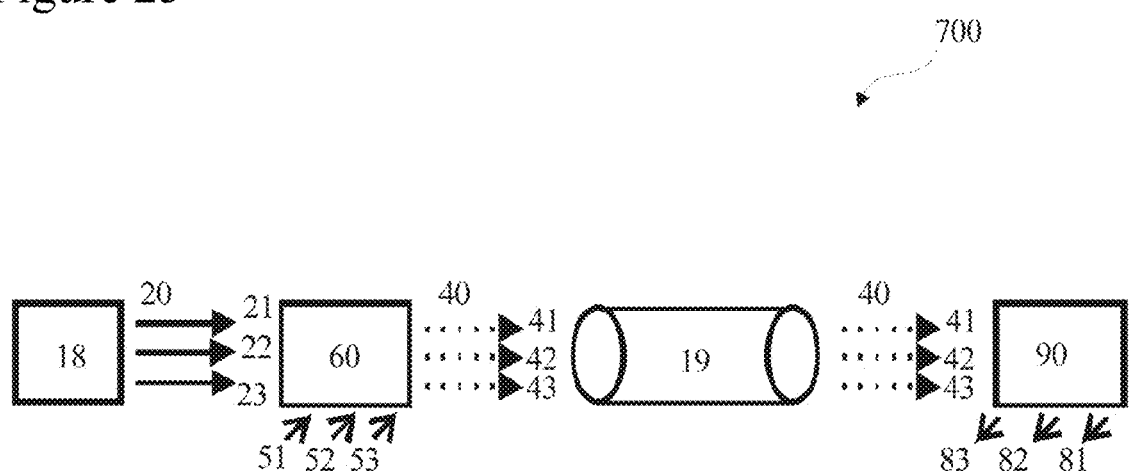
FIG. 25 schematically shows an optical transmission system based on a single low RIN laser according to a preferred embodiment of the present invention.

An optical transmission system 700 according to a preferred embodiment of the present invention is schematically shown in FIG. 25. The transmission system 700 includes a Fabry-Perot laser 18, for example any of the lasers 100, 200, 300, 400, 500 and 600 described in FIGS. 4-7, 12 and 14, a transmitter 60 and a receiver 90. The laser 18 emits a plurality of individual Fabry-Perot modes 20 at different wavelengths. Preferably, each optical signal in the optical transmission system represents a single longitudinal mode. Alternatively, each optical signal may represent a group of a few neighboring longitudinal modes.

In FIG. 25, only three different signals 21, 22, 23 are shown. However, it is preferred that the laser emits more optical signals at different wavelengths.

The transmitter 60 may include waveguides, modulators including, but not limited to, microring resonators, as well as lenses, prisms, arrayed waveguide gratings, and other standard optical components. The waveguides, modulators, and other optical components of the transmitter 60 are preferably embedded into a semiconductor chip. The semiconductor chip is preferably based on a material including, but not limited to, silicon, gallium arsenide, or indium phosphide.

The optical signals 20 enter the transmitter 60. The transmitter is capable of providing modulation to each optical signal independently in response to a plurality of control signals 51, 52, 53. As a result, the transmitter 60 outputs a plurality 40 of the intensity modulated optical signals 41, 42, and 43 at different wavelengths. It is preferred that the number of modulated optical signals 41, 42, and 43 corresponds to a number of CW optical signals 21, 22, and 23, while their wavelengths remain unchanged.

The optical transmission system 700 may further include a transmission line 19 that is intended to guide the modulated optical signals 41, 42, and 43 at different wavelengths outputted from the transmitter 60 to the receiver 90. The transmission line 19 may include optical fibers, planar waveguides, mirrors, lenses or other standard optical components suitable for guiding the light.

The receiver 90 may include waveguides and detectors as well as lenses, prisms, arrayed waveguide gratings, microring resonators, and other standard optical components. The waveguides, detectors, and other optical components of the receiver 90 are preferably embedded into a semiconductor chip. The semiconductor chip is preferably based on a material including, but not limited to, silicon, gallium arsenide, or indium phosphide.

The plurality 40 of the intensity modulated optical signals enter the receiver 90. The receiver 90 is capable of providing detection to each optical signal independently.

Figure 26A:
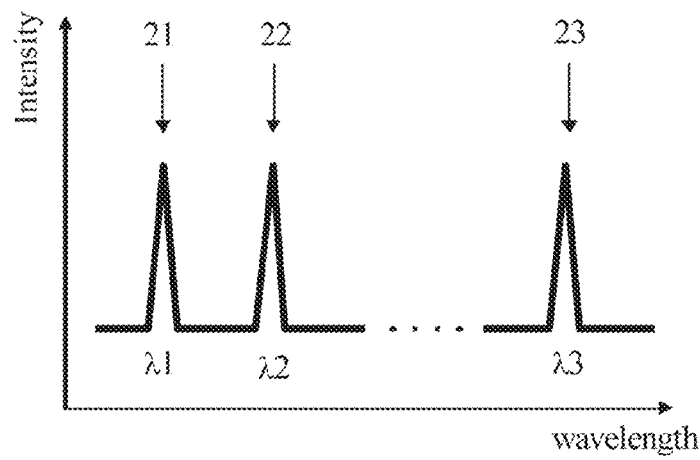
FIG. 26a schematically illustrates a spectrum of a plurality of CW (continuous wave) optical signals 21, 22, and 23.

FIG. 26a schematically illustrates a spectrum of a plurality of optical modes 21, 22, and 23 at different wavelengths $\lambda 1$, $\lambda 2$ and $\lambda 3$, emitted by a laser 100, 200, 300, 400, 500, 600. FIG. 25 and FIG. 26a illustrates only three different modes. However, the laser preferably emits more optical modes at different wavelengths. Each optical signal 21, 22, 23 has total RIN less than 0.2%. Examples of experimental laser spectra with low RIN modes are presented in FIG. 16 and FIG. 24. Each mode can be used as an optical signal.

Figure 26B:
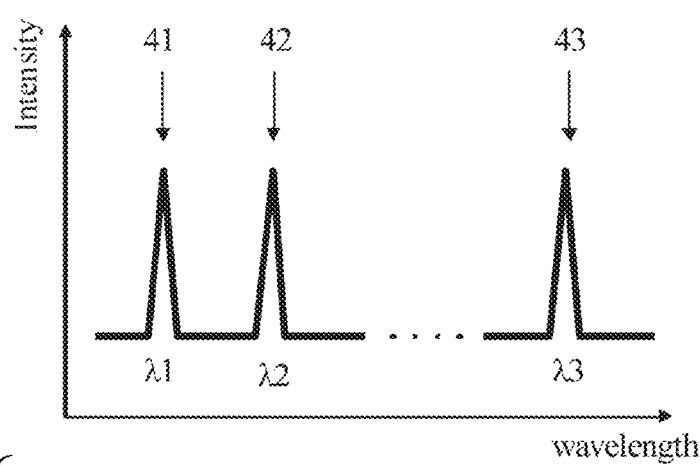
FIG. 26b schematically illustrates a spectrum of a plurality of intensity modulated optical signals 41, 42, and 43.
Figure 26C:
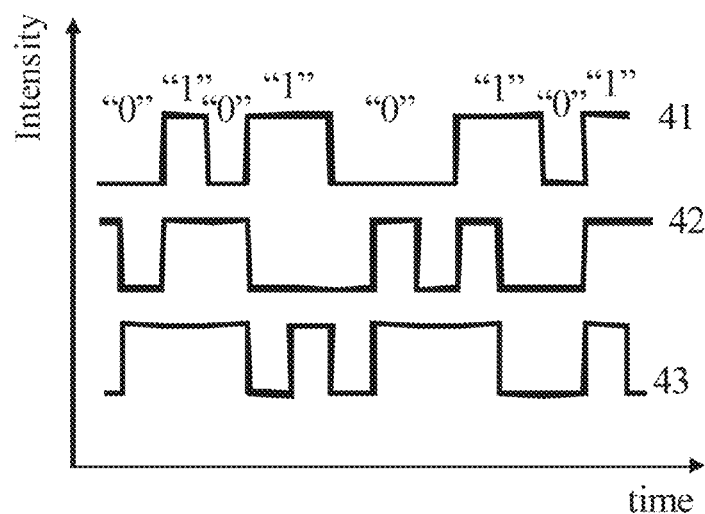
FIG. 26c shows the intensity of the intensity modulated optical signals 41, 42, and 43 over time.

FIGS. 26b and 26c schematically illustrate a spectrum of a plurality of intensity modulated optical signals 41, 42, and 43 and temporal variation of their intensity. The set of wavelengths $\lambda 1$, $\lambda 2$ and $\lambda 3$ remains unchanged while the intensities of the optical signals 41, 42, and 43 are modulated in time in accordance with carrying information.

FIG. 26c schematically shows that the intensity of an optical signal at certain wavelengths (e.g. of optical signal 41 at wavelength $\lambda 1$) is encoded. There are different schemes of encoding. For example, the high intensity of signal 41 may correspond to level "1" of a binary sequence and the low intensity of signal 41 may correspond to level "0" of a binary sequence. Thus, it is possible to carry certain information as a sequence of "0" and "1" binary codes by changing the intensity of the optical signal 41. Because signal 42 at wavelength $\lambda 2$ can be modulated independently, signal 42 (and other signals at other wavelengths) may carry another sequence of binary codes, thereby providing an additional information bearing channel.

Figure 27:
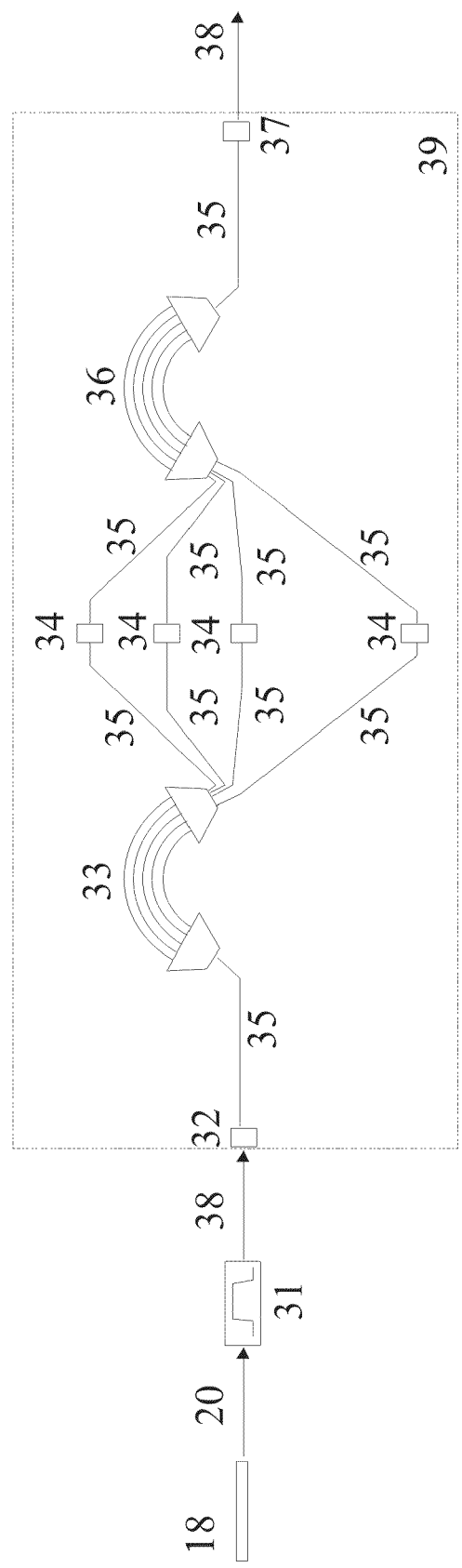
FIG. 27 shows a schematic view of a DWDM source based on individual Fabry-Perot modes of a broadband QD laser as independent optical channels.

One example of an optical transmission system based on a Fabry-Perot laser 18 capable of emitting a sufficient number of well separated optical signals 20 at different wavelengths, for example any of the lasers 100, 200, 300, 400, 500, 600 described in FIGS. 4-7, 12 and 14, is shown in FIG. 27. This is an example only, and other optical transmission systems known in the art could utilize lasers including a noise reducing section, as disclosed herein.

The optical signals 20 serve as information channels. A required number of optical signals may be selected from the single source 18 by a bandpass filter 31, pass through a coupler 32 and then be spectrally separated by a demultiplexer 33, e.g. an arrayed waveguide (AWG). Electrical-to-optical signal transfer occurs in modulators 34. Modulated channels are then jointed together by an AWG multiplexer 36. These modulators 34 and wavelength-division-multiplexing (WDM) elements may be coupled to each other for example by means of planar waveguides 35. A coupler 37 extracts the signal and transfers it to an output fiber 38. At least a portion of the system components are preferably located on a semiconductor chip 39. In one preferred embodiment, the chip 39 is made of silicon, gallium arsenide, indium phosphide, or gallium nitride. As one example, shown in FIG. 27, the coupler 32, demultiplexer 33, modulators 34, waveguides 35, multiplexer 36, coupler, 37 and output fiber 38 are all located on the semiconductor chip 39.

Figure 28A:
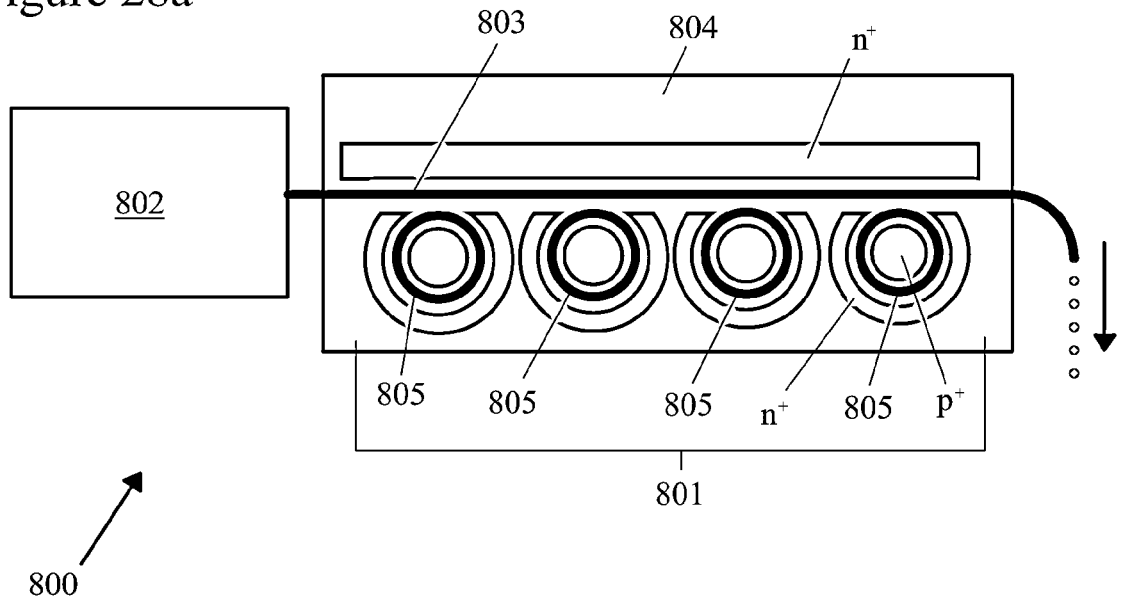
FIG. 28a shows an optical transmission system in an alternative embodiment of the present invention.
Figure 28B:
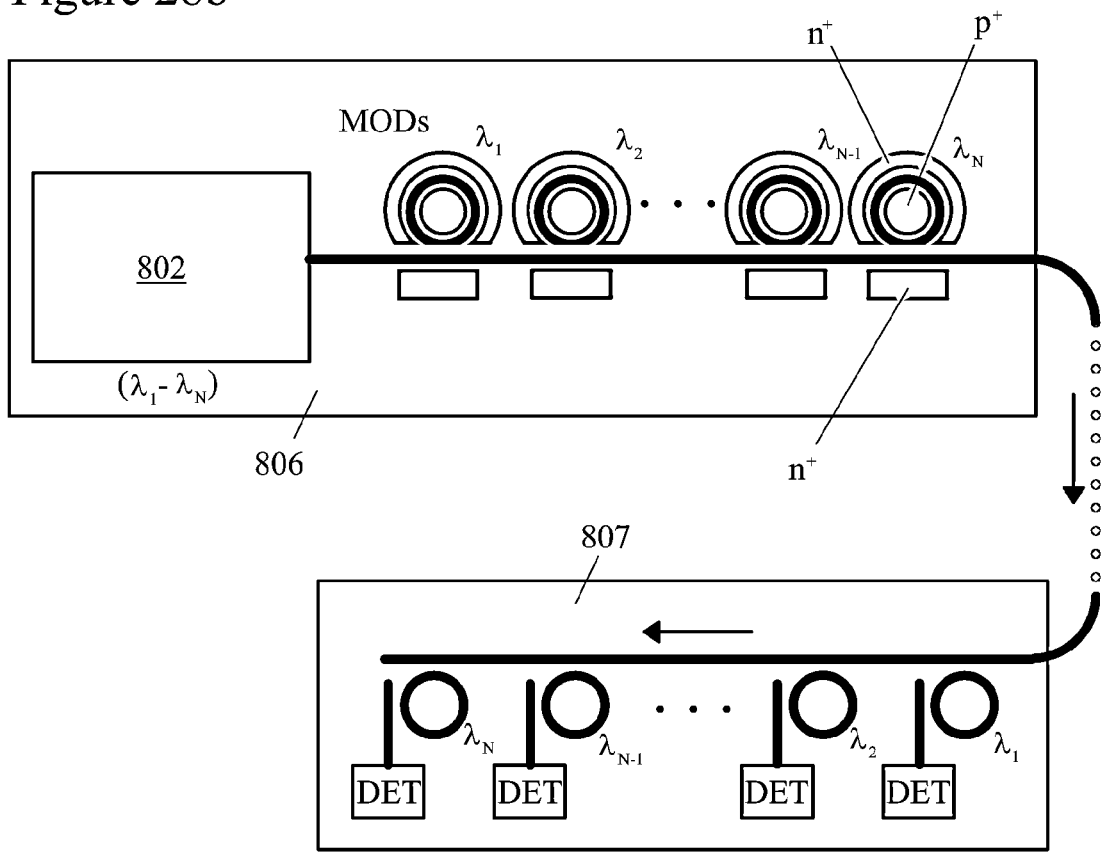
FIG. 28b shows another example of an optical transmission system including a transceiver with microring resonator arrays.

There are other examples and methods for WDM transmitters, most following the functionality outlined in FIG. 27, which utilize a laser with a noise reducing section in preferred embodiments of the present invention. An alternative preferred embodiment of an optical transmission system 800 which can use the lasers disclosed herein is shown in FIGS. 28a and 28b. This type of optical transmission system is disclosed in Q. Xu et al., *Opt. Express,* 14, 20, 2006, pp. 9430-9435 and Q. Xu et al., *Opt. Express,* 15, 2, 2007, pp. 430-436, both herein incorporated by reference. There are no single light sources available in the prior art to be used in this type of optical transmission system. Instead, complicated laser arrays like the one shown in FIG. 1 were needed to provide a light source to this type of system.

In contrast, the present invention uses a single multi-wavelength laser 802 with a noise reducing section (for example, any of the lasers 100, 200, 300, 400, 500, 600 shown in FIGS. 4-7, 12, and 14) as the source. In this embodiment, the optical transmission system 800 includes an in-line microring resonator array 801. This couples the laser, which is a suitable multi-wavelength source 802, to a bus waveguide 803 on a photonics chip 804. While the photonics chip is preferably made of silicon, any other known materials for photonics chips could alternatively be used. Multiple ring resonators 805, one for each wavelength (channel), are disposed along the bus waveguide 803. Each ring 805 in the array 801 is tuned and driven through a p-i-n junction and provides selective wavelength modulation functionality without the need for de-multiplexing and multiplexing. Any number of rings 805 may be used, depending on the system application. As shown in FIG. 28b, the transmitter 806 and the receiver 807 both preferably include microring resonator arrays 805. Alternatively, the transmitter 806 includes ring resonators 805, while the receiver includes other elements known in the art. While not preferred, in other embodiments, the receiver includes ring resonators 805 while the transmitter includes other elements known in the art.

As one example, 10 micro rings, spaced 50 μm apart, may be used. In this example, the array 801 would only occupy 0.5 mm on the chip 804. This creates an extremely compact, inexpensive chip 804. Since the laser 802 is also compact and inexpensive, the entire system is significantly more cost effective and useful than what was available in the prior art. This embodiment is attractive because of its integration and scaling potential.

The optical transmission systems shown in FIGS. 25, 27 and 28 have several advantages compared to optical transmission systems of the prior art, for example the system shown in FIG. 1. First, only one inexpensive low RIN laser is used instead of many costly and sophisticated DFB lasers, where each DFB laser in FIG. 1 requires its own electronic system for wavelength tracking and stabilization. The optical transmission systems of the present invention or, at least a major part of them, can be integrated together on one chip, for example a Si photonic chip. All optical channels being the modes of the same Fabry-perot laser are stabilized and tracked simultaneously. Thus, such a system is very compact and inexpensive since the cost of most silicon photonic devices can be relatively low, like that of silicon electronics.

The present invention also includes methods of operating a quantum dot laser to limit relative intensity noise. The method includes the step of emitting a plurality of optical modes from the laser such that a total relative intensity noise of each optical mode is less than an error-free transmission limit in the 0.001 GHz to 10 GHz range. In a preferred embodiment of the method, the laser emits a plurality of optical modes such that the relative intensity noise of each optical mode is less than 0.2% in the 0.001 GHz to 10 GHz range. The methods preferably also include electrically isolating an active section and at least one noise reducing section of a laser, each of which is monolithically integrated into the laser. An active region of the laser includes a plurality of quantum dots. The methods also preferably include the steps of injecting current at a first current density into the active section. Preferred embodiments of the methods also include the step of injecting current at a second current density into the noise reducing section, where the first current density is greater than the second current density.

In the methods, a relative intensity noise of each individual mode is preferably less than 0.2% and more preferably less than 0.1%. In another preferred embodiment, the plurality of optical modes comprises at least ten optical modes, each optical mode having a relative intensity noise less than 0.2% in the 0.001 GHz to 10 GHz range. The intensity modulation between the optical modes is preferably less than 30%. In other preferred embodiments, the spectral power density of laser emission over a spectral band that includes the plurality of optical modes is greater than 2 mW/nm.

Figure 29:
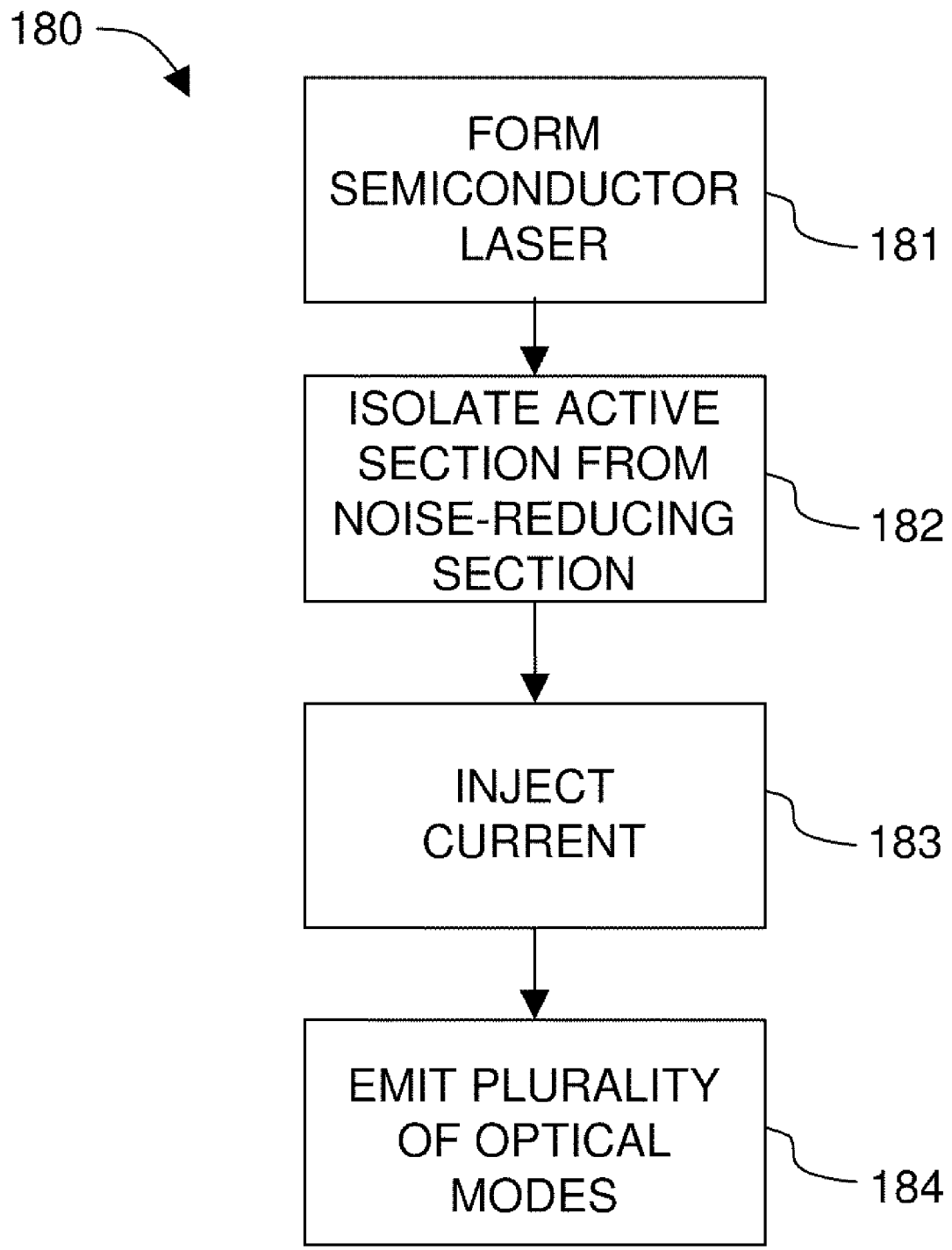
FIG. 29 shows a flowchart of a preferred method of the present invention.

A flowchart showing an example of the steps of a preferred method is shown in FIG. 29. FIG. 29 illustrates a method 180 of generating a plurality of optical modes, according to an embodiment of the invention. For ease of description, the method 180 is described in terms of a quantum dot laser substantially similar to laser 100 in FIG. 4. However, the method could alternatively be used with any of the lasers 18, 100, 200, 300, 400, 500 and 600 and optical transmission systems 700 described herein. In step 181, a semiconductor laser is formed with a monolithically integrated active section 143 and at least one noise reducing section 145. An active region 114 of a waveguiding layer 113 includes one or more arrays of self-organized quantum dots as described previously herein. In step 182, the active section 143 and the noise reducing section 145 are electrically isolated, for example, by the formation of one or more trenches therebetween. In step 183, a current is injected into the active section 143. In step 184, the laser 100 emits a plurality of optical modes, such that the total relative intensity noise of each individual mode emitted is less than 0.2% in the 0.001-10 GHz range. In one embodiment, 10 or more optical modes are emitted by the laser 100 in step 184. In another embodiment, step 183 includes biasing the noise reducing section 145 of the laser with a bias voltage, where the bias voltage is lower than a voltage value required for amplitude modulation mode locked operation of the laser 100. In yet another embodiment, step 183 includes injecting current into the noise-reducing section 145 at a current density lower than the current density of the current injected into the active section 143.

All of the references discussed herein are herein incorporated by reference.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A semiconductor laser comprising:
i) an optical resonator comprising:
a) a first mirror;
b) a second mirror;
c) an active section; and
d) at least one noise reducing section; and
ii) a quantum dot active region comprising at least one quantum dot array;
wherein the active section and the noise reducing section are located between the first mirror and the second mirror and are fabricated as a monolithically integrated structure;
wherein the active section and the noise reducing section are electrically isolated from each other;
wherein the laser is configured to produce an output lasing spectrum using an inhomogeneously broadened ground state transition of the quantum dot array; and
wherein the laser emits a plurality of optical modes such that a total relative intensity noise of each optical mode is less than 0.2% in the 0.001 GHz to 10 GHz range.

2. The laser of claim 1, wherein the laser emits greater than ten optical modes such that the total relative intensity noise of each optical mode is less than 0.2% in the 0.001-10 GHz range.

3. The laser of claim 1, wherein the quantum dot array comprises a plurality of quantum dots configured with a distribution of at least one physical parameter that affects an optical transition energy of the quantum dots such that optical transition energies of the quantum dot active region are inhomogeneously broadened.

4. The laser of claim 3, wherein the physical parameter is selected from the group consisting of: a) quantum dot size; b) quantum dot shape; c) quantum dot chemical composition; d) quantum dot material strain; and e) any combination of a) through d).

5. The laser of claim 1, wherein a spectral power density of laser emission is greater than 2 mW/nm.

6. The laser of claim 1, wherein an intensity distribution between at least ten optical modes of the output lasing spectrum varies by less than 30%.

7. The laser of claim 1, wherein the laser is made of a material selected from the group consisting of: a) InGaAs/AlGaAs; b) InGaAs/GaAsP; c) InGaP/AlGaInP; d) InGaN/AlGaN; and e) any combination of a) through d).

8. The laser of claim 1, wherein the quantum dot array comprises a plurality of quantum dot layers formed such that maximal wavelengths of each quantum dot layer are the same.

9. The laser of claim 1, wherein the quantum dot array comprises a plurality of quantum dot layers formed such that maximal wavelengths of each quantum dot layer are shifted with respect to each other for at least 3 nm.

10. The laser of claim 1, wherein the quantum dot active region comprises In(Ga)As/GaAs quantum dots.

11. The laser of claim 1, wherein the active section and the noise reducing section are electrically isolated by at least one trench etched in a top contact layer of the laser.

12. The laser of claim 1, wherein the laser is configured to inject current into the noise reducing section at a first current density and inject current into the active section at a second current density, wherein the second current density has a value greater than a value of the first current density.

13. The laser of claim 1, wherein the noise reducing section is reverse biased with a voltage that is lower than a voltage required for operation in an amplitude modulation mode-locking regime.

14. The laser of claim 1, wherein the optical resonator is a Fabry-Perot resonator and the optical modes are Fabry-Perot modes.

15. The laser of claim 14, wherein the first mirror and the second mirror are cleaved facets.

16. The laser of claim 14, wherein at least one of the first mirror and the second mirror comprises dielectric coatings.

17. The laser of claim 14, wherein a total length of the optical resonator is 0.3-10 mm.

18. The laser of claim 17, wherein a total length of the noise reducing section is in a range of 5-30% of the total length of the optical resonator.

19. The laser of claim 18, wherein the laser is configured in ridge geometry such that the laser operates in a single spatial mode regime.

20. The laser of claim 1, further comprising a p-type contact formed only on the active section and absent from the noise reducing section.

21. The laser of claim 1, further comprising a p-type contact formed on the active section and the noise reducing section, wherein current is injected only in the active section, and no bias is applied to the noise reducing section.

22. The laser of claim 21, wherein the active section and the noise reducing section are electrically isolated by a trench etched in the p-type contact, a contact layer of the laser and a portion of a cladding layer of the laser.

23. The laser of claim 1, further comprising a spectral filter that restricts a width of emission spectrum to a desired number of optical channels.

24. The laser of claim 1, wherein at least one of the first mirror or the second mirror has a substantially flat-topped reflectivity maximum such that a lasing spectrum is limited to a desired number of optical modes.

25. The laser of claim 24, wherein the reflectivity maximum is within the inhomogeneously broadened ground state optical transition of the quantum dot array.

26. The laser of claim 1, wherein at least one of the first mirror or the second mirror is a first-order distributed Bragg reflector configured to restrict the output lasing spectrum.

27. The laser of claim 1, wherein at least one of the first mirror or the second mirror is a second-order distributed Bragg reflector configured to direct at least a portion of laser emission along an optical path that is substantially perpendicular lengthwise to the optical resonator.

28. The laser of claim 27 further comprising a monolithically integrated lens that focuses the portion of the laser emission directed perpendicular to the optical resonator.

29. The laser of claim 1, wherein at least one of the first mirror or the second mirror is a chirped Bragg reflector.

30. The laser of claim 1, wherein a length of the noise reducing section is in a range of 5% to 30% of a total length of the optical resonator.

31. The laser of claim 1, wherein the noise reducing section comprises a first noise reducing section and a second noise reducing section.

32. The laser of claim 31, wherein a combined length of the first noise reducing section and the second noise reducing section is in a range of 5% to 30% of a total length of the optical resonator.

33. The laser of claim 1, wherein the laser operates in a continuous wave regime.

34. The laser of claim 1, wherein the laser emits a plurality of optical modes such that a total relative intensity noise of each individual mode is less than 0.1% in the 0.001 GHz to 10 GHz range.

35. The laser of claim 1, wherein a length of the noise reducing section is between 75 and 100 µm.

36. The laser of claim 1, wherein the laser is not a mode-locked laser with amplitude modulation.

37. An optical transmission system comprising:
a) a semiconductor laser comprising:
  i) an optical resonator comprising:
    A) a first mirror;
    B) a second mirror;
    C) an active section; and
    D) at least one noise reducing section; and
  ii) a quantum dot active region comprising a quantum dot array;
wherein the active section and the noise reducing section are disposed between the first mirror and the second mirror and are fabricated as a monolithically integrated structure;
wherein the active section and the noise reducing section are electrically isolated from each other;
wherein the laser is configured to produce an output lasing spectrum using an inhomogeneously broadened ground state transition of the quantum dot array;
wherein the laser emits a plurality of optical modes such that a total relative intensity noise of each optical mode is less than 0.2% in the 0.001 GHz to 10 GHz range; and
wherein the plurality of optical modes serve as a plurality of optical information signals;
b) a transmitter that provides modulation to each optical signal independently; and
c) a receiver that provides detection to each optical signal independently.

38. The optical transmission system of claim 37, wherein the transmitter comprises at least one waveguide and at least one modulator embedded into a first semiconductor chip and the receiver comprises at least one waveguide and at least one detector embedded into a second semiconductor chip.

39. The optical transmission system of claim 38, wherein the modulator is a microring resonator.

40. The optical transmission system of claim 37, further comprising a transmission line to guide the optical signals from the transmitter to the receiver.

41. The optical transmission system of claim 38, wherein the first semiconductor chip and/or the second semiconductor chip comprises a material selected from the group consisting of: a) silicon; b) gallium arsenide; c) indium phosphide; and d) any combination of a) through c).

42. The optical transmission system of claim 37, wherein the receiver comprise a microring array.

* * * * *